United States Patent
Chen et al.

(10) Patent No.: US 9,508,575 B2
(45) Date of Patent: *Nov. 29, 2016

(54) DISK/PAD CLEAN WITH WAFER AND WAFER EDGE/BEVEL CLEAN MODULE FOR CHEMICAL MECHANICAL POLISHING

(71) Applicant: Applied Materials, Inc., Santa Clara, CA (US)

(72) Inventors: Hui Chen, Burlingame, CA (US); Sen-Hou Ko, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 261 days.

This patent is subject to a terminal disclaimer.

(21) Appl. No.: 14/198,150

(22) Filed: Mar. 5, 2014

(65) Prior Publication Data
US 2014/0261539 A1    Sep. 18, 2014

Related U.S. Application Data

(60) Provisional application No. 61/794,875, filed on Mar. 15, 2013.

(51) Int. Cl.
*B08B 1/04* (2006.01)
*B08B 11/02* (2006.01)
*H01L 21/67* (2006.01)
*H01L 21/02* (2006.01)
*B08B 1/00* (2006.01)

(52) U.S. Cl.
CPC ......... *H01L 21/67178* (2013.01); *B08B 1/006* (2013.01); *B08B 1/04* (2013.01);
(Continued)

(58) Field of Classification Search
CPC ............... H01L 21/02041; H01L 21/02052; H01L 21/67161; H01L 21/67178; H01L 21/67766; H01L 21/67288; H01L 21/67219; H01L 21/670511; H01L 21/67046; B08B 1/006; B08B 1/04
See application file for complete search history.

(56) References Cited

U.S. PATENT DOCUMENTS 5,282,289 A * 2/1994 Hasegawa ......... H01L 21/67028
                                                        15/21.1
5,357,645 A * 10/1994 Onodera .................... B08B 1/04
                                                         134/83

(Continued)

FOREIGN PATENT DOCUMENTS

JP   2004-288727 A    10/2004
JP   2011-098436 A     5/2011
KR  10-2011-0010391 A  2/2011

OTHER PUBLICATIONS

International Search Report and Written Opinion for International Application No. PCT/US2014/020717 dated Jun. 25, 2014.

*Primary Examiner* — Saeed T Chaudhry
(74) *Attorney, Agent, or Firm* — Patterson & Sheridan, LLP

(57) ABSTRACT

A method and apparatus for cleaning a substrate after chemical mechanical planarizing (CMP) is provided. The apparatus comprises a housing, a substrate holder rotatable on a first axis and configured to retain a substrate in a substantially vertical orientation, a first pad holder having a pad retaining surface facing the substrate holder in a parallel and space apart relation, the first pad holder rotatable on a second axis rotatable parallel to the first axis, a first actuator operable to move the pad holder relative to the substrate holder to change a distance defined between the first axis and the second axis, and a second pad holder disposed in the housing, the second pad holder having a pad retaining surface facing the substrate holder in a parallel and spaced apart relation, wherein the second pad holder is couple with a rotary arm.

18 Claims, 16 Drawing Sheets

(52) U.S. Cl.
CPC ... *H01L21/02041* (2013.01); *H01L 21/02065* (2013.01); *H01L 21/02087* (2013.01); *H01L 21/67051* (2013.01); *H01L 21/67219* (2013.01)

(56) References Cited

U.S. PATENT DOCUMENTS

| | | |
|---|---|---|
| 6,926,587 B2 | 8/2005 | Takeuchi |
| 7,326,103 B2 | 2/2008 | Sakurai et al. |
| 2002/0164929 A1 | 11/2002 | Pinson et al. |
| 2011/0021115 A1 | 1/2011 | Oh et al. |
| 2011/0244762 A1 | 10/2011 | Schwandner et al. |
| 2013/0185884 A1 | 7/2013 | Ko et al. |
| 2013/0196572 A1 | 8/2013 | Ko et al. |
| 2014/0209239 A1* | 7/2014 | Ko .................. B24B 37/34 156/345.14 |

* cited by examiner

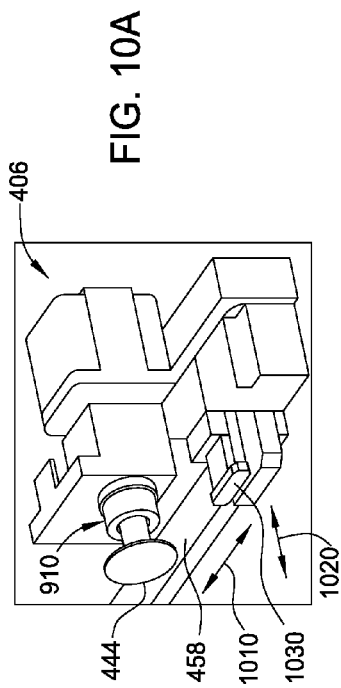
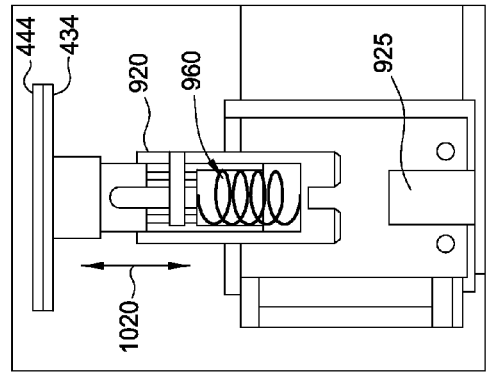
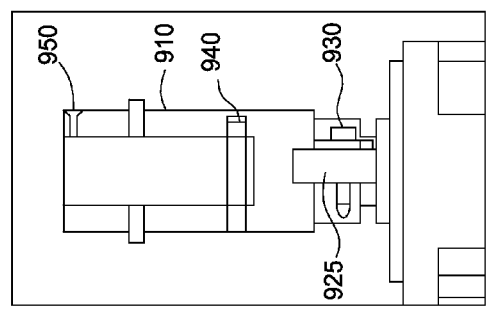
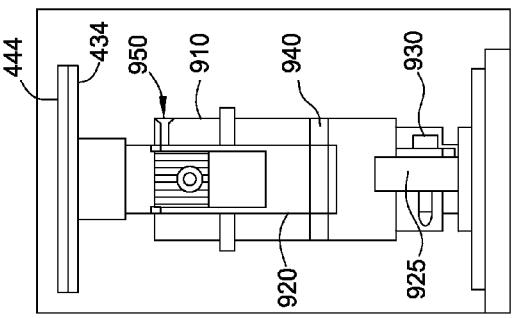

DISK/PAD CLEAN WITH WAFER AND WAFER EDGE/BEVEL CLEAN MODULE FOR CHEMICAL MECHANICAL POLISHING

CROSS-REFERENCE TO RELATED APPLICATIONS

This application claims benefit of U.S. Provisional Patent Application Ser. No. 61/794,875, filed Mar. 15, 2013, which is herein incorporated by reference in its entirety.

BACKGROUND

Field

Implementations of the present invention relate to a method and apparatus for cleaning a substrate after chemical mechanical planarizing (CMP).

Description of the Related Art

In the process of fabricating modern semiconductor integrated circuits (ICs), it is often necessary to planarize surfaces prior to depositing subsequent layers to ensure accurate formation of photoresist masks and to maintain stack tolerances. One method for planarizing a layer during IC fabrication is chemical mechanical planarizing (CMP). In general, CMP involves the relative movement of the substrate held in a polishing head against a polishing material to remove surface irregularities from the substrate. In a CMP process, the polishing material is wetted with a polishing fluid that may contain at least one of an abrasive or chemical polishing composition. This process may be electrically assisted to electrochemically planarize conductive material on the substrate.

Planarizing hard materials such as oxides typically requires that the polishing fluid or the polishing material itself include abrasives. As the abrasives often cling or become partially embedded in the layer of material being polished, the substrate is processed on a buffing module to remove the abrasives from the polished layer. The buffing module removes the abrasives and polishing fluid used during the CMP process by moving the substrate which is still retained in the polishing head against a buffing material in the presence of deionized water or chemical solutions. The buffing module is substantially identical to the CMP module except for the polishing fluids utilized and the material on which the substrate is processed.

Once buffed, the substrate is transferred to a series of cleaning modules that further remove any remaining abrasive particles and/or other contaminants that cling to the substrate after the planarizing and buffing process before they can harden on the substrate and create defects. The cleaning modules may include, for example, a megasonic cleaner, a scrubber or scrubbers, and a dryer. The cleaning modules that support the substrates in a vertical orientation are especially advantageous, as they also utilize gravity to enhance removal of particles during the cleaning process, and are also typically more compact.

Although present CMP processes have been shown to be robust and reliable systems, the configuration of the system equipment requires the buffing module to utilize critical space which could alternatively be utilized for additional CMP modules. However, certain polishing fluids, for example those using cerium oxide, are particularly difficult to remove and conventionally require processing the substrate in buffing module before being transferred to the cleaning module as conventional cleaning modules have not demonstrated the ability to satisfactorily remove abrasive particles from oxide surfaces that have not been buffed prior to cleaning.

Therefore, there is a need in the art for an improved CMP process and cleaning module.

SUMMARY

Implementations of the present invention relate to a method and apparatus for cleaning a substrate after chemical mechanical planarizing (CMP). In one implementation, a particle cleaning module is provided. The particle cleaning module comprises a housing, a substrate holder disposed in the housing, the substrate holder configured to retain a substrate in a substantially vertical orientation, the substrate holder rotatable on a first axis, a first pad holder disposed in the housing, the first pad holder having a pad retaining surface facing the substrate holder in a parallel and space apart relation, the first pad holder rotatable on a second axis rotatable parallel to the first axis, a first actuator operable to move the first pad holder relative to the substrate holder to change a distance defined between the first axis and the second axis, and a second pad holder disposed in the housing, the second pad holder having a pad retaining surface facing the substrate holder in a parallel and spaced apart relation, the second pad holder rotatable on a third axis parallel to the first axis and the second axis.

In one implementation, a particle cleaning module is provided. The particle cleaning module comprises a housing, a substrate holder disposed in the housing, a first pad holder disposed in the housing, a second pad holder disposed in the housing and a rotary arm assembly. The substrate holder is configured to retain a substrate in a substantially vertical orientation and the substrate holder rotatable on a first axis. The first pad holder has a pad retaining surface facing the substrate holder in a parallel and spaced apart relation, the first pad holder rotatable on a second axis rotatable parallel to the first axis. A first actuator operable to move the first pad holder relative to the substrate holder to change a distance defined between the first axis and the second axis. The second pad holder has a pad retaining surface facing the substrate holder in a parallel and spaced apart relation, the second pad holder rotatable on a third axis parallel to the first axis and the second axis. The rotary arm assembly comprises a rotary arm coupled with the second pad holder and operable for sweeping the second pad holder across the surface of the substrate and a lateral actuator mechanism form moving the rotary arm toward the substrate.

In another implementation, a method for cleaning a substrate is provided. The method comprises spinning a substrate disposed in a vertical orientation, providing a cleaning fluid to a surface of the spinning substrate, pressing a first pad against the spinning substrate, moving the first pad laterally across the substrate, providing a polishing fluid to an edge portion of the spinning substrate, pressing a second pad against the spinning substrate, and moving the second pad laterally across the edge of the substrate. Pressing the first pad against the spinning substrate may further comprise spinning the first pad. Pressing the first pad against the spinning substrate may further comprise spinning the first pad. The method may further comprise placing the substrate in a megasonic cleaning module prior to moving the first pad laterally across the substrate, placing the substrate in one or more brush modules after moving the second pad laterally across the edge of the substrate and placing the substrate in dryer after placing the substrate in the one or more brush modules. The method may further comprise planarizing a surface of the substrate prior to placing the substrate in the megasonic cleaning module. The method may further comprise providing the cleaning fluid to the substrate after moving the first pad laterally across the substrate and prior to placing the substrate in the one or more brush modules.

In yet another implementation, a method for cleaning a substrate is provided. The method comprises spinning a substrate disposed in a vertical orientation, providing a cleaning fluid to a surface of the spinning substrate, pressing a first pad against the spinning substrate, moving the first pad across the substrate along a curved path, providing a polishing fluid to an exclusion region and/or edge portion of the spinning substrate, pressing a second pad against the spinning substrate and moving the second pad laterally across the edge of the substrate.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

FIGS. 10A-10D are schematic view of the disk pad holder according to implementations described herein;

To facilitate understanding, identical reference numerals have been used, wherever possible, to designate identical elements that are common to the Figures. Additionally, elements of one implementation may be advantageously adapted for utilization in other implementations described herein.

DETAILED DESCRIPTION

Figure 1:
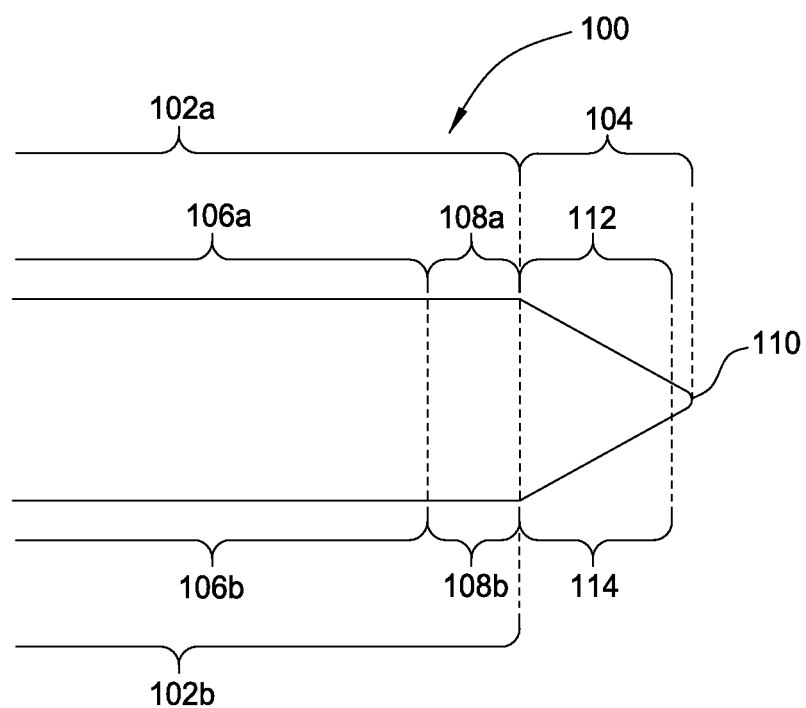
FIG. 1 is a schematic illustration of a cross-section of a portion of a substrate.

Implementations of the present invention relate to a method and apparatus for cleaning a substrate after chemical mechanical planarizing (CMP). More specifically implementations of the present invention provide improved methods and apparatus for cleaning and/or polishing the exclusion region and/or edge of a substrate. Abrasive particles (e.g., cerium oxide (CeO)) used in oxide CMP are difficult to remove using traditional PVA brush scrubbing and often require performance of a buffing process on an additional platen on the polishing tool. However even with buffing on the polishing platen particles at the wafer edge (e.g. ≤2 mm) are very difficult to remove.

Certain implementations described herein provide a clean process where slurry polishing is performed at the exclusion region and/or edge of a wafer after particle cleaning. Certain implementations of the current invention provide an apparatus where a slurry polishing process at the exclusion region and/or edge of a wafer is implemented without affecting the polishing performance in the device area. The apparatus, described below as a particle cleaning module, advantageously allows for increased utilization and throughput of the CMP system, while reducing the amount and cost of consumables needed to effectively clean a substrate as further described below.

The particle cleaning module has a wafer chuck which may support a full wafer size and a disk brush holder with a diameter of less than 50 mm. The wafer chuck speed may be more than 500 rpm and the disk brush holder speed may be more than 1000 rpm. A soft pad, such as politex type material, may be used as a cleaning pad. The cleaning pad may be adhered on top of the disk brush holder with a pressure sensitive adhesive. During the cleaning process, the wafer is rotated by the wafer chuck and the disk brush with the soft pad rotates and sweeps from the center of the wafer to the edge of the wafer or vice versa. The contact pressure and/or gap between the soft pad and the wafer may be controlled by a linear motor. This motion may be repeated several times until the abrasive particles are removed from most of the wafer surface, except the wafer edge at 2 mm edge exclusion. Afterward, a polishing step is performed where a polishing pad is moved to the edge of the wafer and the slurry is delivered next to the polishing pad where the wafer and the pad are rotated and contacted during the polishing. It is desirable to have the polishing pad only polish the exclusion region and/or edge region without touching the device region. The polishing pad may rotate at high speed as well as sweep back and forth at the edge of the wafer. In certain implementations it desirable to have separate pads, a first pad for removing particles from the surface of the wafer and a second pad for polishing at the wafer edge where a local slurry is delivered.

In certain implementations, the particle cleaning module uses a rotary arm in place of the lateral linear motion design. The Disk/Pad/Fluid Jet module design uses the rotary arm motion concept to control the Disk/Pad/Fluid Jet to scan on the wafer surface. By using the rotary arm motion design, the processing tank sealing and servicing is easier and production costs are cheaper than the current lateral linear motion Disk/Pad/Fluid Jet design.

In certain implementations, the particle cleaning module design provides a common design layout for multi-wafer processing. For example, by replacing the Disk, Pad or Fluid Jet, it can perform many kinds of wafer cleaning processes in this common module. The particle cleaning module also provides a flexible edge clean disk/pad for wafer edge cleaning and wafer bevel cleaning. The Disk/Pad/Fluid Jet may be moved in and out to control the processing force and distance to wafer surface. The Disk/Pad clean pressure force on the wafer may be set from 0~5 Lb. Further, the wafer vacuum chuck design provides full wafer support for higher Disk/Pad processing force. The wafer gripper design provides wafer edge-contact for both sides of the wafer (front and back) during processing and rinsing.

Implementations described herein will be described below in reference to a planarizing process and composition that can be carried out using chemical mechanical polishing process equipment, such as MIRRA™, MIRRA MESA™, REFLEXION®, REFLEXION LK™, and REFLEXION® GT™ chemical mechanical planarizing systems, available from Applied Materials, Inc. of Santa Clara, Calif. Other planarizing modules, including those that use processing pads, planarizing webs, or a combination thereof, and those that move a substrate relative to a planarizing surface in a rotational, linear, or other planar motion may also be adapted to benefit from the implementations described herein. In addition, any system enabling chemical mechanical polishing using the methods or compositions described herein can be used to advantage. The following apparatus description is illustrative and should not be construed or interpreted as limiting the scope of the implementations described herein.

FIG. 1 is a schematic illustration of a cross-section of a portion of a substrate 100. With reference to FIG. 1, a substrate 100 may include two major surfaces 102a, 102b and an edge 104. Each major surface 102a, 102b of the substrate 100 may include a device region 106a, 106b and an exclusion region 108a, 108b. (Typically however, only one of the two major surfaces 102a, 102b will include a device region and an exclusion region.) The exclusion regions 108a, 108b may serve as buffers between the device regions 106a, 106b and the edge 104. The edge 104 of a substrate 100 may include an outer edge 110 and bevels 112, 114. The bevels 112, 114 may be located between the outer edge 110 and the exclusion regions 108a, 108b of the two major surfaces 102a, 102b. The present invention is adapted to clean and/or polish the outer edge 110 and at least one bevel 112, 114 of a substrate 100 without affecting the device regions 106a, 106b. In some implementations, all or part of the exclusion regions 108a, 108b may be cleaned or polished as well.

Figure 2:
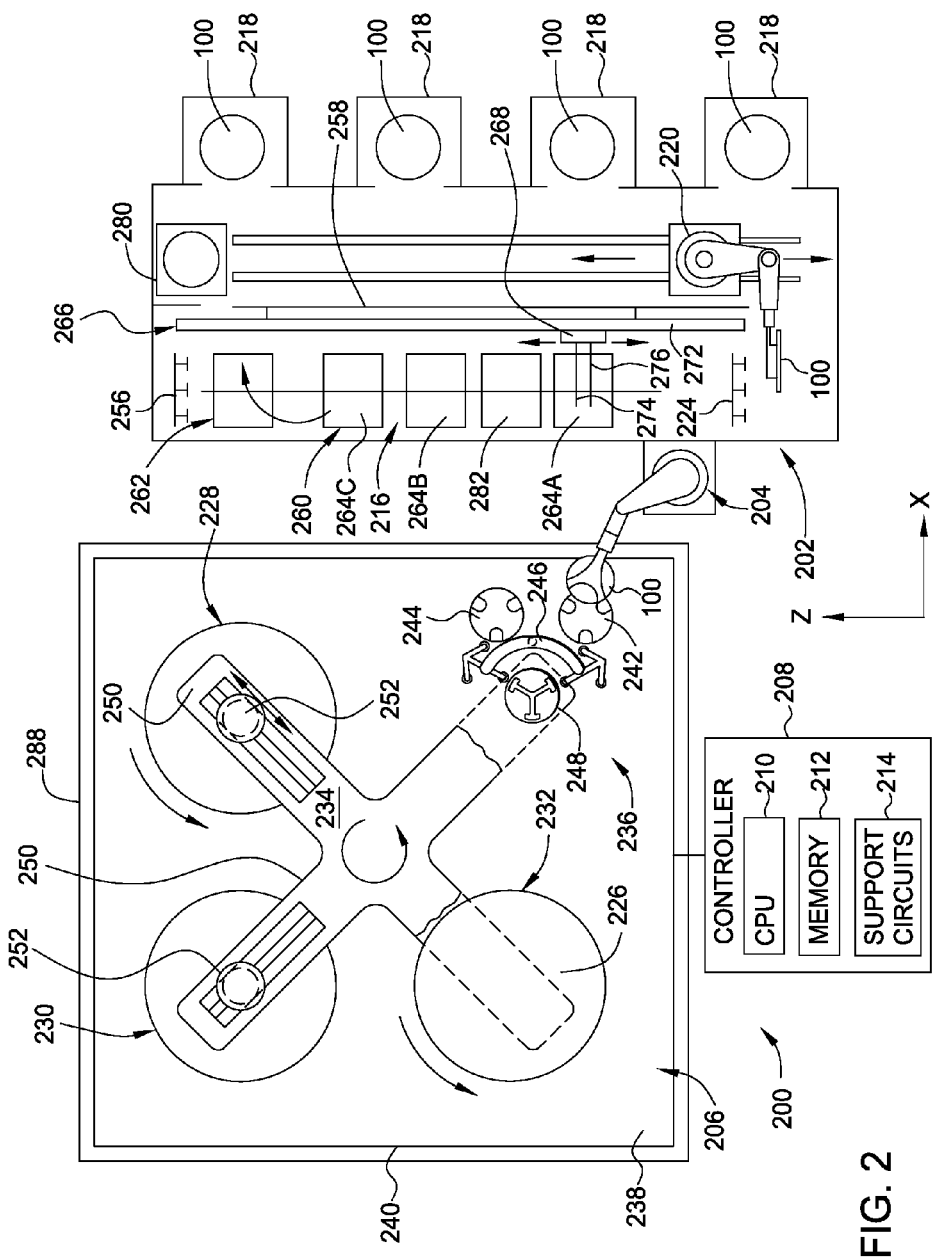
FIG. 2 illustrates a top view of a semiconductor substrate chemical mechanical planarization system having a cleaning system which includes one implementation of a particle cleaning module according to implementations described herein.

FIG. 2 illustrates a top view of a semiconductor substrate chemical mechanical planarization (CMP) system 200 having a cleaning system 216 that includes one implementation of a particle cleaning module 282 of the present invention. Although the exemplary configurations are provided for the CMP system 200 and cleaning system 216 in FIG. 2, it is contemplated that implementations of the particle cleaning module 282 of the present invention may be utilized alone, or with cleaning systems having alternative configurations and/or CMP systems having alternative configurations.

In addition to the cleaning system 216, the exemplary CMP system 200 generally includes a factory interface 202, a loading robot 204, and a planarizing module 206. The loading robot 204 is disposed proximate the factory interface 202 and the planarizing module 206 to facilitate the transfer of substrates 100 therebetween.

A controller 208 is provided to facilitate control and integration of the modules of the CMP system 200. The controller 208 comprises a central processing unit (CPU) 210, a memory 212 and support circuits 214. The controller 208 is coupled to the various components of the CMP system 200 to facilitate control of, for example, the planarizing cleaning and transfer processes.

The factory interface 202 generally includes an interface robot 220 and one or more substrate cassettes 218. The interface robot 220 is employed to transfer substrates 100 between the substrate cassettes 218, the cleaning system 216 and an input module 224. The input module 224 is positioned to facilitate transfer of substrates 100 between the planarizing module 206 and the factory interface 202 as will be further described below.

Optionally, polished substrates exiting the cleaning system 216 may be tested in a metrology system 280 disposed in the factory interface 202. The metrology system 280 may include an optical measuring device, such as the NovaScan 420, available from Nova Measuring Instruments, Inc. located in Sunnyvale, Calif. The metrology system 280 may include a buffer station (not shown) for facilitating entry and egress of substrates from the optical measuring device or other metrology device. One such suitable buffer is described in U.S. Pat. No. 6,244,931, issued Jun. 12, 2001 to Pinson, et al.

The planarizing module 206 includes at least one CMP station. It is contemplated that the CMP station maybe configured as an electrochemical mechanical planarizing station. In the implementation depicted in FIG. 2, the planarizing module 206 includes a plurality of CMP stations, illustrated as a first station 228, a second station 230 and a third station 232 disposed in an environmentally controlled enclosure 288. The first station 228 includes a conventional CMP station configured to perform an oxide planarization process utilizing an abrasive containing polishing fluid. It is contemplated that CMP processes to planarized other materials may be alternatively performed, including the use of other types of polishing fluids. As the CMP process is conventional in nature, further description thereof has been omitted for the sake of brevity. The second station 230 and the third station 232 will be discussed in detail further below.

The exemplary planarizing module 206 also includes a transfer station 236 and a carousel 234 that are disposed on an upper or first side 238 of a machine base 240. In one implementation, the transfer station 236 includes an input buffer station 242, an output buffer station 244, a transfer robot 246 and a load cup assembly 248. The loading robot 204 is configured to retrieve substrates from the input module 224 and transfer the substrates to the input buffer station 242. The loading robot 204 is also utilized to return polished substrates from the output buffer station 244 to the input module 224, from where the polished substrates are then advanced through the cleaning system 216 prior to being returned to the substrate cassettes 218 coupled to the factory interface 202 by the interface robot 220. The transfer robot 246 is utilized to move substrates between the buffer stations 242, 244 and the load cup assembly 248.

In one implementation, the transfer robot 246 includes two gripper assemblies, each having pneumatic gripper fingers that hold the substrate by the substrate's edge. The transfer robot 246 may simultaneously transfer a substrate to be processed from the input buffer station 242 to the load cup assembly 248 while transferring a processed substrate from the load cup assembly 248 to the output buffer station 244. An example of a transfer station that may be used to advantage is described in United States Patent Application No. 6,156,124, issued Dec. 5, 2000 to Tobin.

The carousel 234 is centrally disposed on the machine base 240. The carousel 234 typically includes a plurality of arms 250, each supporting a polishing head assembly 252. Two of the arms 250 depicted in FIG. 2 are shown in phantom such that a planarizing surface of a polishing pad 226 of the first station 228 and the transfer station 236 may be seen. The carousel 234 is indexable such that the polishing head assemblies 252 may be moved between the planarizing stations 228, 230, 232 and the transfer station 236. One carousel that may be utilized to advantage is described in U.S. Pat. No. 5,804,507, issued Sep. 8, 1998 to Perlov, et al.

The cleaning system 216 removes polishing debris, abrasives, polishing fluid, and/or excess deposited material from the polished substrates that remains after polishing. The cleaning system 216 includes a plurality of cleaning modules 260, a substrate handler 266, a dryer 262 and an output module 256. The substrate handler 266 retrieves a processed substrate 100 returning from the planarizing module 206 from the input module 224 and transfers the substrate 100 through the plurality of cleaning modules 260 and dryer 262. The dryer 262 dries substrates exiting the cleaning system 216 and facilitates substrate transfer between the cleaning system 216 and the factory interface 202 by the interface robot 220. The dryer 262 may be a spin-rinse-dryer or other suitable dryer. One example of a suitable dryer 262 may be found as part of the MESA™ or Desica® Substrate Cleaners, both available from Applied Materials, Inc., of Santa Clara, Calif.

In the implementation depicted in FIG. 2, the cleaning modules 260 utilized in the cleaning system 216 include a megasonic clearing module 264A, the particle cleaning module 282, a first brush module 264B and a second brush module 264C. However, it is to be appreciated that the particle cleaning module 282 of the present invention may be used with cleaning systems incorporating one or more modules having one or more types of modules. Each of the cleaning modules 260 is configured to process a vertically oriented substrate, i.e., one in which the polished surface is in a substantially vertical plane. The vertical plane is represented by the Y-axis, which is perpendicular to the X-axis and Z-axis shown in FIG. 2. The particle cleaning module 282 will be discussed in detail further below with reference to FIG. 4.

In operation, the CMP system 200 is initiated with the substrate 100 being transferred from one of the substrate cassettes 218 to the input module 224 by the interface robot 220. The loading robot 204 then moves the substrate from the input module 224 to the transfer station 236 of the planarizing module 206. The substrate 100 is loaded into the polishing head assembly 252 moved over and polished against the polishing pad 226 while in a horizontal orientation. Once the substrate is polished, polished substrates 100 are returned to the transfer station 236 from where the loading robot 204 may transfer the substrate 100 from the planarizing module 206 to the input module 224 while rotating the substrate to a vertical orientation. The substrate handler 266 then retrieves the substrate from the input module 224 transfers the substrate through the cleaning modules 260 of the cleaning system 216. Each of the cleaning modules 260 is adapted to support a substrate in a vertical orientation throughout the cleaning process. Once cleaned, the cleaned substrate 100 is to the output module 256. The cleaned substrate 100 is returned to one of the substrate cassettes 218 by the interface robot 220 while returning the cleaned substrate 100 to a horizontal orientation. Optionally, the interface robot 220 may transfer the cleaned substrate to the metrology system 280 prior to the substrate's return to one of the substrate cassettes 218.

Although any suitable substrate handler may be utilized, the substrate handler 266 depicted in FIG. 2 includes a robot 268 having at least one substrate gripper (two substrate grippers 274, 276 are shown) that is configured to transfer substrates between the input module 224, the cleaning modules 260 and the dryer 262. Optionally, the substrate handler 266 may include a second robot (not shown) configured to transfer the substrate between the last cleaning module 260 and the dryer 262 to reduce cross contamination.

In the implementation depicted in FIG. 2, the substrate handler 266 includes a rail 272 coupled to a partition 258 separating the substrate cassettes 218 and interface robot 220 from the cleaning system 216. The robot 268 is configured to move laterally along the rail 272 to facilitate access to the cleaning modules 260, dryer 262 and the input and output modules 224, 256.

Figure 3:
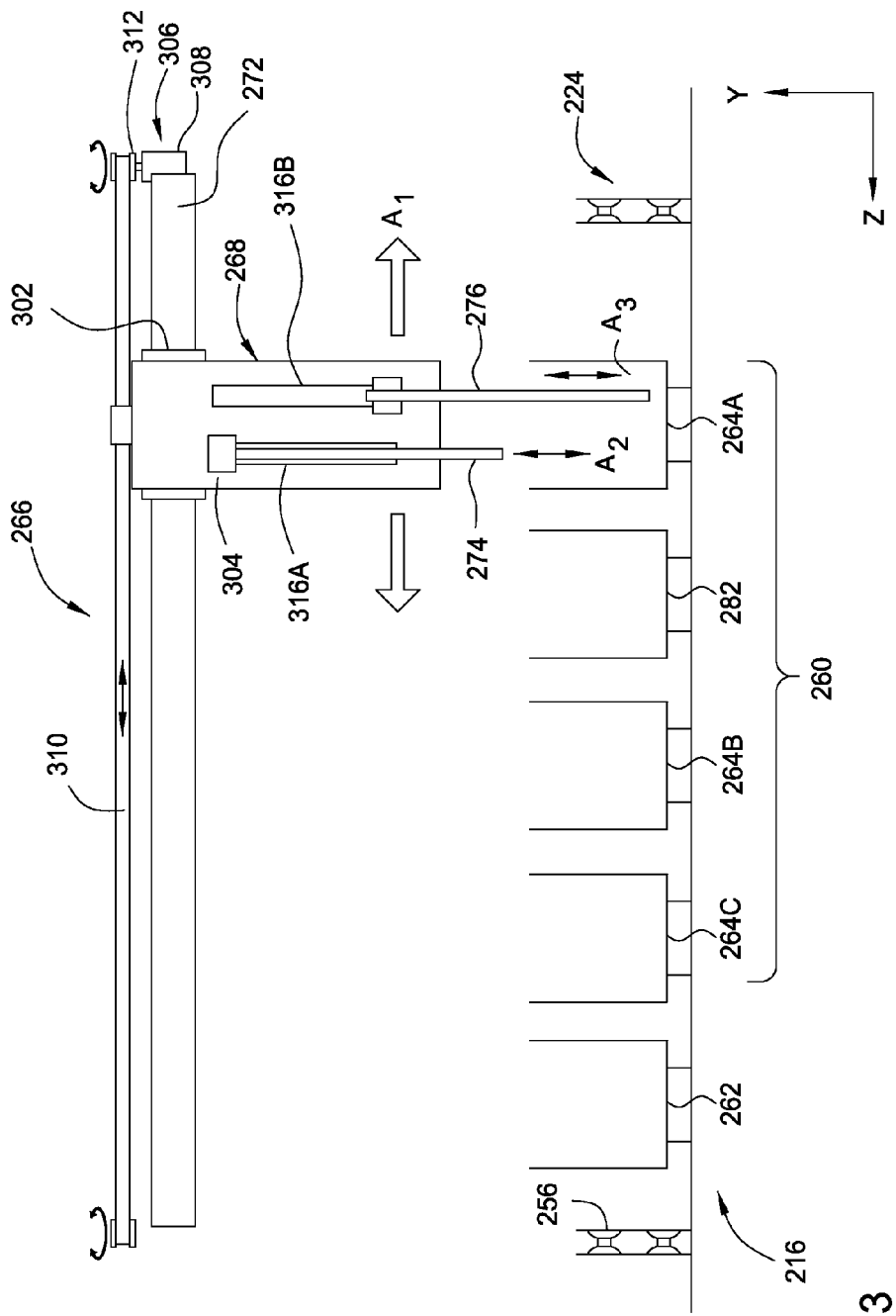
FIG. 3 is a front view of cleaning system depicted in FIG. 2 according to implementations described herein.

FIG. 3 depicts a front view of the substrate handler 266 according to one implementation of the invention. The robot 268 of the substrate handler 266 includes a carriage 302, a mounting plate 304 and the substrate grippers 274, 276. The carriage 302 is slidably mounted on the rail 272 and is driven horizontally by an actuator 306 along a first axis of motion $A_1$ defined by the rail 272 which is parallel to the Z-axis. The actuator 306 includes a motor 308 coupled to a belt 310. The carriage 302 is attached to the belt 310. As the motor 308 advances the belt 310 around the sheave 312 positioned at one end of the cleaning system 216, the carriage 302 moves along the rail 272 to selectively position the robot 268. The motor 308 may include an encoder (not shown) to assist in accurately positioning the robot 268 over the input and output modules 224, 256 and the various cleaning modules 260. Alternatively, the actuator 306 may be any form of a rotary or linear actuator capable of controlling the position of the carriage 302 along the rail 272. In one implementation, the carriage 302 is driven by a linear actuator having a belt drive, such as the GL15B linear actuator commercially available from THK Co., Ltd. located in Tokyo, Japan.

The mounting plate 304 is coupled to the carriage first 302. The mounting plate 304 includes at least two parallel tracks 316A-B along which the positions of the substrate grippers 274, 276 are independently actuated along a second and third axes of motion $A_2$, $A_3$. The second and third axes of motion $A_2$, $A_3$ are oriented perpendicular to the first axis $A_1$ and are parallel to the Y-axis.

Figure 4:
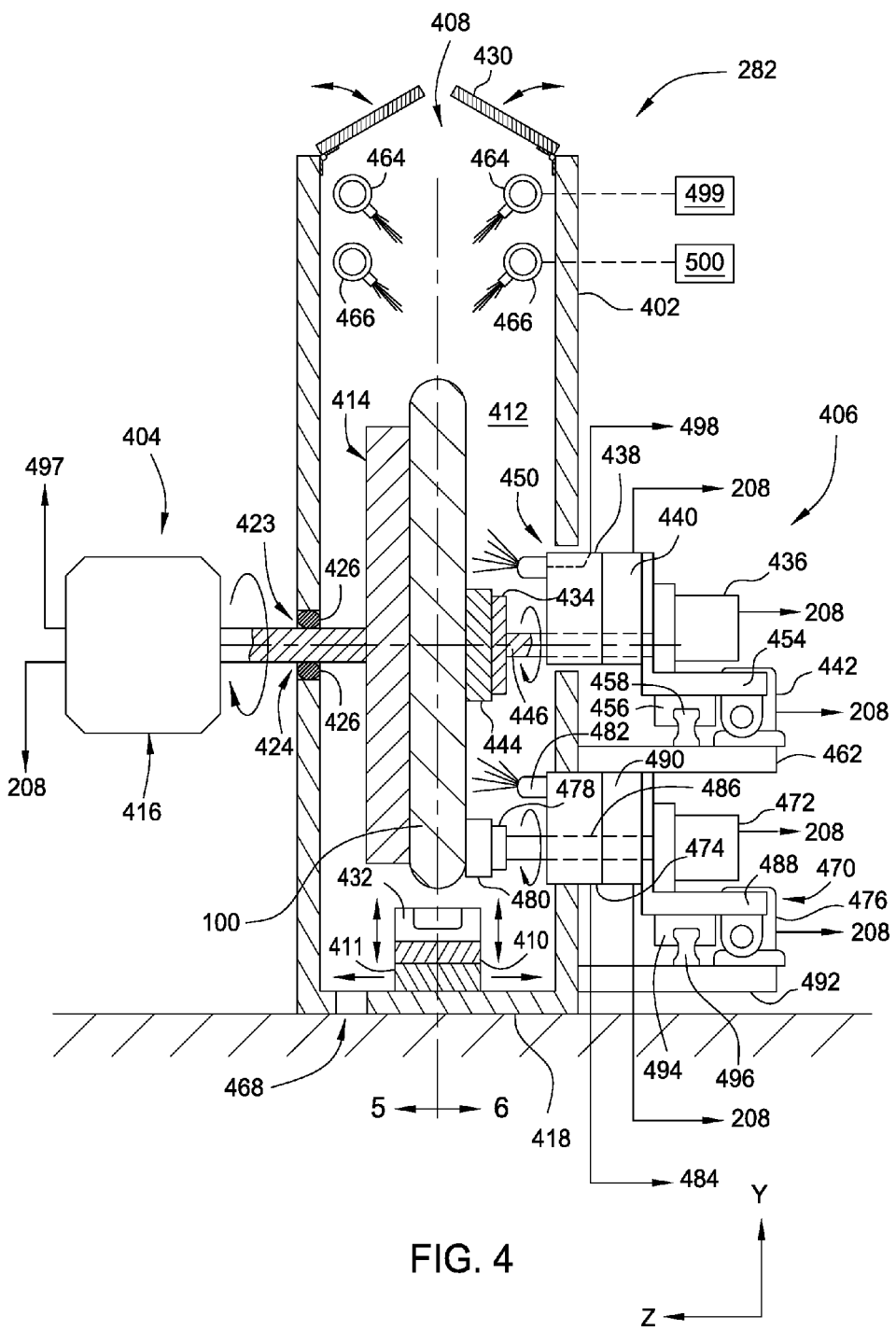
FIG. 4 is a cross-sectional view of the particle cleaning module depicted in FIG. 2 according to implementations described herein.

FIG. 4 depicts a cross-sectional view of the particle cleaning module 282 of FIG. 2. The particle cleaning module 282 includes a housing 402, a substrate rotation assembly 404, a first pad actuation assembly 406 and a second pad actuation assembly 470. Although a first pad actuation assembly 406 and a second pad actuation assembly 470 are shown, it should be understood that the implementations described herein may be performed with a single pad actuation assembly. For example, the first pad actuation assembly 406 and the second pad actuation assembly 470 may be positioned in separate housings. The housing 402 includes an opening 408 at a top of the housing and a substrate receiver 410 at a bottom 418 of the housing. A drain 468 is formed through the bottom 418 of the housing 402 to allow fluids to be removed from the housing 402. The opening 408 allows the robot 268 (not shown in FIG. 4) to vertically transfer the substrate to an internal volume 412 defined within the housing 402. The housing 402 may optionally include a lid 430 that can open and close to allow the robot 268 in and out of the housing 402.

The substrate receiver 410 has a substrate receiving slot 432 facing upwards parallel to the Y-axis. The substrate receiving slot 432 is sized to accept the perimeter of the substrate 100, thereby allowing the one of the substrate grippers 274, 276 of the substrate handler 266 to place the substrate 100 in the substrate receiving slot 432 in a substantially vertical orientation. The substrate receiver 410 is coupled to a Z-Y actuator 411. The Z-Y actuator 411 may be actuated to move the substrate receiver 410 upwards in the Y-axis to align a centerline of the substrate 100 disposed in the substrate receiver 410 with a centerline of the substrate rotation assembly 404. Once the centerline of the substrate 100 is aligned with the centerline of the substrate rotation assembly 404, the Z-Y actuator 411 may be actuated to move the substrate receiver 410 in the Z-axis to contact the substrate 100 against the substrate rotation assembly 404, which then actuates to chuck the substrate 100 to the substrate rotation assembly 404. After the substrate 100 has been chucked to the substrate rotation assembly 404, the Z-Y actuator 411 may be actuated to move the substrate receiver 410 in the Y-axis clear of the substrate 100 and the substrate rotation assembly 404 so that the substrate 100 held by the substrate rotation assembly 404 may be rotated without contacting the substrate receiver 410.

The substrate rotation assembly 404 is disposed in the housing 402 and includes a substrate holder 414 coupled to a substrate rotation mechanism 416. The substrate holder 414 may be an electrostatic chuck, a vacuum chuck, a mechanical gripper or any other suitable mechanism for securely holding the substrate 100 while the substrate is rotated during processing within the particle cleaning module 282. Preferably, the substrate holder 414 is either an electrostatic chuck or a vacuum chuck.

Figure 5:
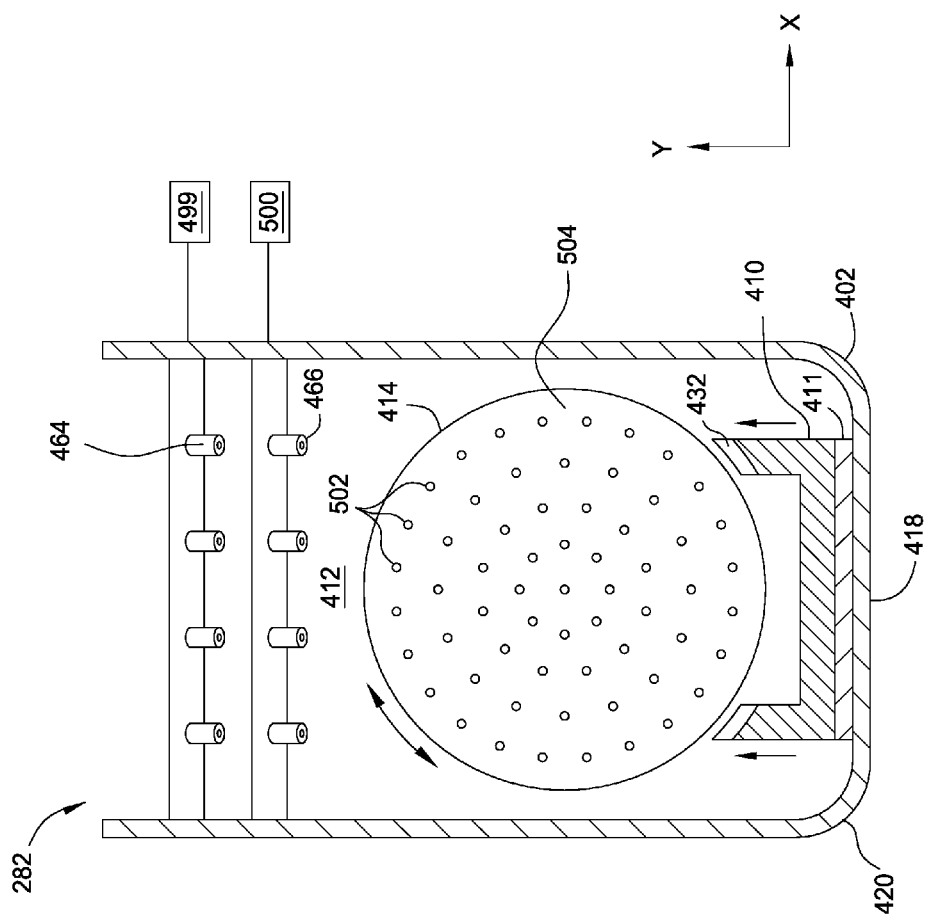
FIG. 5 is a cross-sectional view of the particle cleaning module taken along the section line 5-5 of FIG. 4 according to implementations described herein.

FIG. 5 is a cross-sectional view of the particle cleaning module 282 taken along the section line 5-5 of FIG. 4 thus illustrating a face 504 of the substrate holder 414. Referring to both FIG. 4 and FIG. 5, the face 504 of the substrate holder 414 includes one or more apertures 502 fluidly coupled to a vacuum source 497. The vacuum source 497 is operable to apply a vacuum between the substrate 100 and the substrate holder 414, thereby securing the substrate 100 and the substrate holder 414. Once the substrate 100 is held by the substrate holder 414, the substrate receiver 410 moves downward in a vertical direction parallel to the Y-axis towards the bottom 418 of the housing 402 to be clear of the substrate, as seen in FIG. 5. The substrate receiver 410 may move in a horizontal direction towards an edge 420 of the housing 402 to be further clear of the substrate.

The substrate holder 414 is coupled to the substrate rotation mechanism 416 by a first shaft 423 that extends through a hole 424 formed through the housing 402. The hole 424 may optionally include sealing members 426 to provide a seal between the first shaft 423 and the housing 402. The substrate holder 414 is controllably rotated by the substrate rotation mechanism 416. The substrate rotation mechanism 416 may be an electrical motor, an air motor, or any other motor suitable for rotating the substrate holder 414 and substrate 100 chucked thereto. The substrate rotation mechanism 416 is coupled to the controller 208. In operation, the substrate rotation mechanism 416 rotates the first shaft 423, which rotates the substrate holder 414 and the substrate 100 secured thereto. In one implementation the substrate rotation mechanism 416 rotates the substrate holder 414 (and substrate 100) at a rate of at least 500 revolutions per minute (rpm).

The first pad actuation assembly 406 includes a pad rotation mechanism 436, a pad cleaning head 438, and a lateral actuator mechanism 442. The pad cleaning head 438 is located in the internal volume 412 of the housing 402 and includes a first pad holder 434 that holds a pad 444 and a fluid delivery nozzle 450. The fluid delivery nozzle 450 is coupled to a fluid delivery source 498 that provides deionized water, a chemical solution or any other suitable fluid to the pad 444 during cleaning the substrate 100. The lid 430 may be moved to a position that closes the opening 408 of the housing 402 above the fluid delivery nozzle 450 to prevent fluids from being spun out of the housing 402 during processing.

A centerline of the first pad holder 434 may be aligned with the centerline of the substrate holder 414. The first pad holder 434 (and pad 444) has a diameter much less than that of the substrate 100, for example at least less than half the diameter of the substrate or even as much as less than about one eighth the diameter of the substrate. In one implementation, the first pad holder 434 (and pad 444) may have a diameter of less than about 25 mm. The first pad holder 434 may holds the pad 444 utilizing clamps, vacuum, adhesive or other suitable technique that allows for the pad 444 to periodically be replaced as the pad 444 becomes worn after cleaning a number of substrates 100.

The pad 444 may be fabricated from a polymer material, such as porous rubber, polyurethane and the like, for example, a POLYTEX™ pad available from Rodel, Inc, of Newark, Del. In one implementation, the pad holder 434 may be used to a hold a brush or any other suitable cleaning device. The first pad holder 434 is coupled to the pad rotation mechanism 436 by a second shaft 446. The second shaft 446 is oriented parallel to the Z-axis and extends from the internal volume 412 through an elongated slit formed through the housing 402 to the pad rotation mechanism 436. The pad rotation mechanism 436 may be an electrical motor, an air motor, or any other suitable motor for rotating the first pad holder 434 and pad 444 against the substrate. The pad rotation mechanism 436 is coupled to the controller 208. In one implementation, the pad rotation mechanism 436 rotates the first pad holder 434 (and pad 444) at a rate of at least about 1000 rpm.

The pad rotation mechanism 436 is coupled to bracket 454 by an axial actuator 440. The axial actuator 440 is coupled to the controller 208 or other suitable controller and is operable to move the first pad holder 434 along the Z-axis to move the pad 444 against and clear of the substrate 100 held by the substrate holder 414. The axial actuator 440 may be a pancake cylinder, linear actuator or any other suitable mechanism for moving the first pad holder 434 in a direction parallel to the Z-axis. In operation, after the substrate holder 414 is in contact with and holding the substrate, the axial actuator 440 drives the first pad holder 434 in a z-direction to make contact with the substrate 100.

Figure 6:
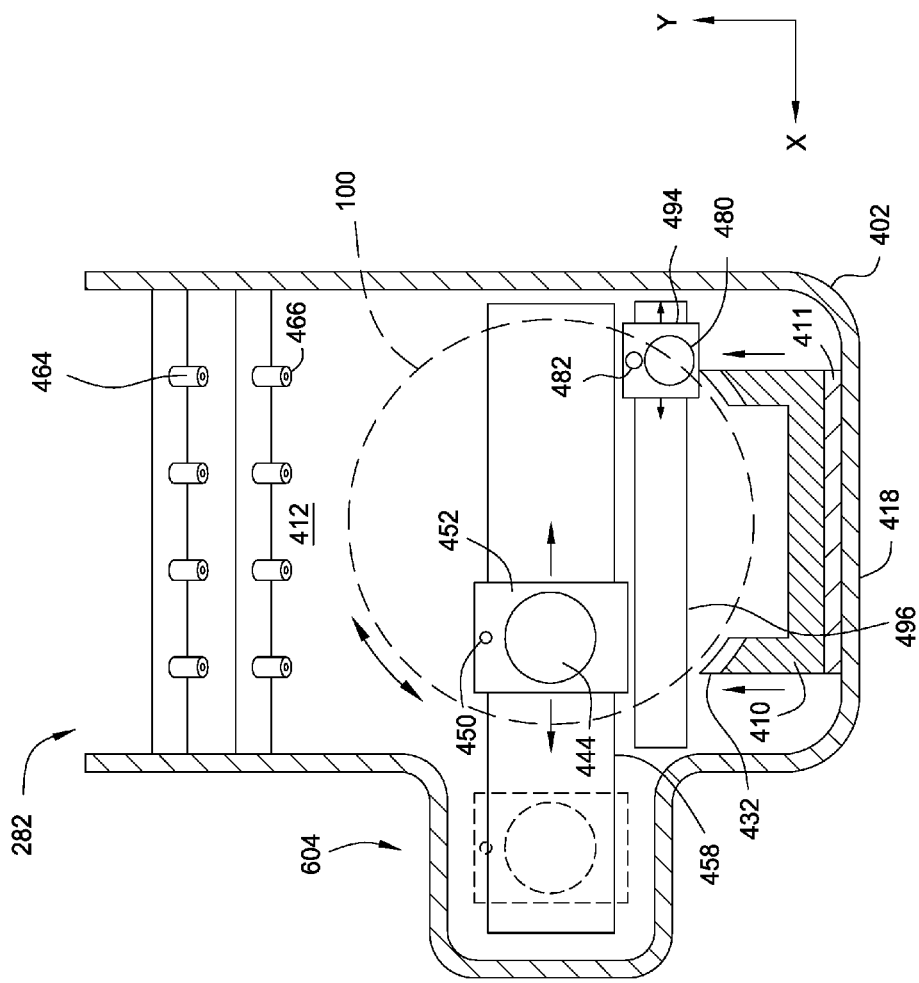
FIG. 6 is a cross-sectional view of the particle cleaning module taken along the section line 6-6 of FIG. 4 according to implementations described herein.

The bracket 454 is coupled to a base 462 by the lateral actuator mechanism 442 by a carriage 456 and rail 458 that allows the pad cleaning head 438 to move laterally in a direction parallel to the X-axis, as depicted in FIG. 6. The carriage 456 is slidably mounted on the rail 458 and is driven horizontally by the lateral actuator mechanism 442 to scan the pad 444 across the substrate 100. The lateral actuator mechanism 442 may be a lead screw, a linear actuator or any other suitable mechanism for moving the pad cleaning head 438 horizontally. The lateral actuator mechanism 442 is coupled to controller 208 or other suitable controller.

The second pad actuation assembly 470 includes a pad rotation mechanism 472, a pad polishing head 474, and a lateral actuator mechanism 476. The pad polishing head 474 is located in the internal volume 412 of the housing 402 and includes a second pad holder 478 that holds a polishing pad 480 and a fluid delivery nozzle 482. The fluid delivery nozzle 450 is coupled to a fluid delivery source 484 that provides polishing slurry, deionized water, a chemical solution or any other suitable fluid to the polishing pad 480 during polishing of the exclusion region and/or edge region of the substrate 100. The lid 430 may be moved to a position that closes the opening 408 of the housing 402 above the fluid delivery nozzle 482 to prevent fluids from being spun out of the housing 402 during processing.

A centerline of the second pad holder 478 may be aligned with the edge of the substrate 100. The second pad holder 478 (and polishing pad 480) has a diameter much less than that of the substrate 100, for example at least less than half the diameter of the substrate or even as much as less than about one eighth the diameter of the substrate. In one implementation, the second pad holder 478 (and polishing pad 480) may have a diameter of less than about 50 mm. The second pad holder 478 may hold the polishing pad 480 utilizing clamps, vacuum, adhesive or other suitable techniques that allow for the polishing pad 480 to periodically be replaced as the polishing pad 480 becomes worn after polishing the edge of a number of substrates 100.

The polishing pad 480 may be fabricated from a polymer material, such as porous rubber, polyurethane and the like, for example, a POLYTEX™ pad available from Rodel, Inc. of Newark, Del. The polishing pad 480 may be a fixed abrasive pad. The second pad holder 478 is coupled to the pad rotation mechanism 472 by a third shaft 486. The third shaft 486 is oriented parallel to the Z-axis and extends from the internal volume 412 through an elongated slit formed through the housing 402 to the pad rotation mechanism 472. The pad rotation mechanism 472 may be an electrical motor, an air motor, or any other suitable motor for rotating the second pad holder 478 and polishing pad 480 against the substrate 100. The pad rotation mechanism 472 is coupled to the controller 208. In one implementation, the pad rotation mechanism 472 rotates the second pad holder 478 (and polishing pad 480) at a rate of at least about 1000 rpm.

The pad rotation mechanism 472 is coupled to bracket 488 by an axial actuator 490. The axial actuator 490 is coupled to the controller 208 or other suitable controller and is operable to move the second pad holder 478 along the Z-axis to move the polishing pad 480 against and clear of the substrate 100 held by the substrate holder 414. The axial actuator 490 may be a pancake cylinder, linear actuator or any other suitable mechanism for moving the second pad holder 478 in a direction parallel to the Z-axis. In operation, after the substrate holder 414 is in contact with and holding the substrate, the axial actuator 490 drives the second pad holder 478 in a z-direction to make contact with the substrate 100.

The bracket 488 is coupled to a base 492 by the lateral actuator mechanism 476 by a carriage 494 and rail 496 that allows the pad polishing head 474 to move laterally in a direction parallel to the X-axis, as depicted in FIG. 6. The carriage 494 is slidably mounted on the rail 496 and is driven horizontally by the lateral actuator mechanism 476 to scan the polishing pad 480 across the substrate 100. The lateral actuator mechanism 476 may be a lead screw, a linear actuator or any other suitable mechanism for moving the pad polishing head 474 horizontally. The lateral actuator mechanism 476 is coupled to controller 208 or other suitable controller.

Scanning the pad 444 across the substrate 100 in the particle cleaning module 282 has effectively demonstrated the ability to effectively remove particles, such as abrasives from the polishing fluid, from the surface of the substrate 100. Further, scanning the polishing pad 480 across the exclusion region and/or edge region has demonstrated the ability to effectively remove particles, such as abrasives, excess deposited material, and/or polishing slurry from the surface of the substrate 100, for example, the exclusion region and/or edge region of the substrate. Thus, the inclusion of a polishing step at the wafer edge in addition to particle cleaning has effectively demonstrated edge defect improvement. Accordingly, the need for a dedicated buffing station on the polishing module is substantially eliminated.

Figure 7:
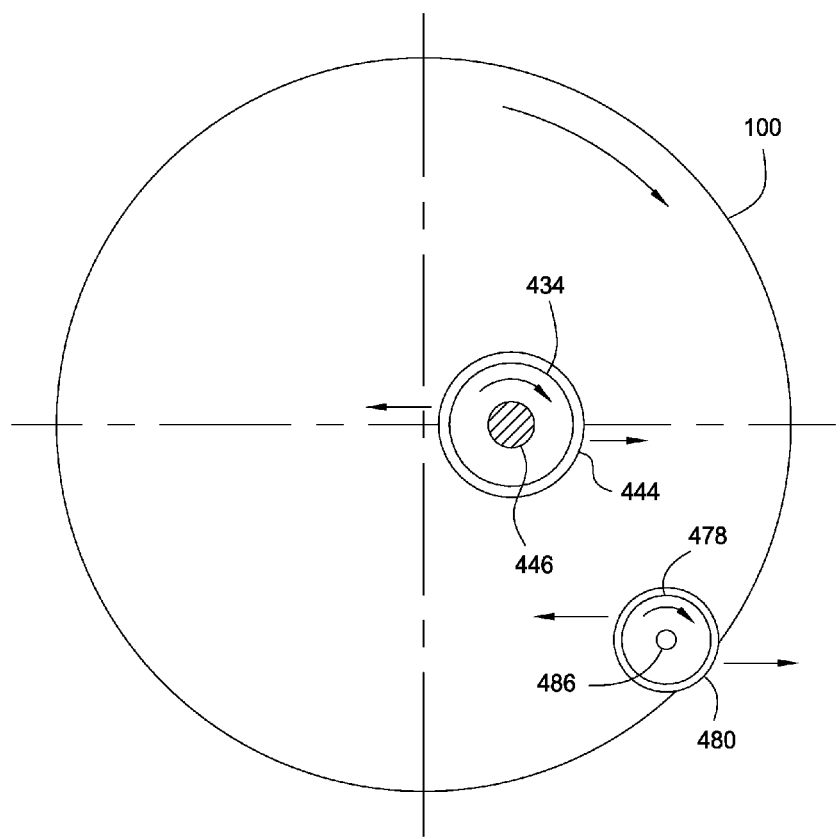
FIG. 7 is a top view of a pad holder engaging a pad with a substrate retained by the substrate holder within the particle cleaning module of FIG. 2 according to implementations described herein.

FIG. 7 is a side view of the first pad holder 434 and the second pad holder 478 engaging pad 444 and pad 480 respectively with the substrate 100 retained by the substrate holder 414. In operation, with respect to the first pad holder 434, the axial actuator 440 urges the pad 444 against the substrate 100 rotated by the substrate rotation mechanism 416 while the pad rotation mechanism 436 spins the pad 444. The lateral actuator mechanism 442 moves the first pad holder 434 and pad 444 in a horizontal direction across the surface of the substrate 100. While the pad 444 is in contact with the substrate 100, the fluid delivery nozzle 450 provides at least one of deionized water, a chemical solution or any other suitable fluid to the surface of the substrate 100 being processed by the pad 444. Accordingly, the pad 444 cleans the surface of the substrate with minimal movement.

In operation, with respect to the second pad holder 478, the axial actuator 490 urges the polishing pad 480 against the substrate 100 rotated by the substrate rotation mechanism 416 while the pad rotation mechanism 472 spins the polishing pad 480. The lateral actuator mechanism 476 moves the second pad holder 478 and the polishing pad 480 in a horizontal direction across the surface of the substrate 100. While the polishing pad 480 is in contact with the exclusion region and/or edge region of the substrate 100, the fluid delivery nozzle 482 provides at least one of polishing slurry, deionized water, a chemical solution or any other suitable fluid to the surface of the substrate 100 being processed by the polishing pad 480. Accordingly, the pad 444 cleans the edge of the substrate with minimal movement.

It should be understood that although FIG. 7 depicts pad 444 and polishing pad 480 simultaneously contacting substrate 100, the implementations described herein do not require simultaneous contact of the substrate by the pad 444 and the polishing pad 480. For example, the particle cleaning process performed by pad 444 may be performed sequentially (e.g., prior to and/or after) with respect to the edge polishing process performed by polishing pad 480.

One advantage of the invention is the relatively small size of the pads 444 and 480 compared to the size of the substrate 100. Conventional systems use large pads positioned on the polishing module to clean smaller substrates, where the substrate is in 100 percent contact with the pad. Large pads are prone to trapping abrasives and particulates which often cause scratches and defects in the substrate. However, the smaller pad of the present invention is significantly less prone to abrasive and particulate trapping, which advantageously results in a cleaner pad and substrates with less scratches and defects. Additionally, the smaller pad of the present invention significantly reduces the cost of consumables, both in the amount of fluid utilized during processing and the cost of replacement pads. Furthermore, the smaller pad of the present invention significantly allows the pad to be easily removed or replaced.

Referring back to FIG. 6, once the substrate is cleaned and the edge of the substrate has been polished, the pad actuation assemblies 406, 470 retract the pad holders 434, 478 and pads 444, 480 away from the substrate 100 (shown in phantom). The first pad holder 434 and pad 444 may be moved linearly in a direction parallel to the X-axis away from the substrate and out of the internal volume 412 of the housing 402 into a pocket 604 coupled to the housing 402. Positioning the first pad holder 434 and pad 444 in the pocket 604 as shown in phantom in FIG. 6 and out of the internal volume 412 of the housing 402 advantageously provides more space for the robot 268 to enter the housing 402 and transfer the substrate without risk of damaging either the pad 444 or the substrate 100, while allowing the housing 402 to be smaller and less expensive.

Substrate transfer begins after cleaning by having the substrate receiver 410 move upward in a direction parallel to the Y-axis to engage the substrate 100 in the substrate receiving slot 432. Once the substrate is disposed in the substrate receiving slot 432, the substrate holder 414 releases the substrate 100 by turning off the vacuum provided by the vacuum source 497, and optionally providing a gas through the apertures 502 of the substrate holder 414 to separate the substrate from the substrate holder 414. The substrate receiver 410 with the substrate 100 disposed in the substrate receiving slot 432 is then moved laterally away from the substrate holder 414 in a direction parallel to the Z-axis to clear the substrate 100 from the substrate holder 414. One of the substrate grippers 274, 276 of the robot 268 retrieves the substrate 100 from the substrate receiver 410 and removes the substrate 100 from the housing 402. An optional top spray bar 464 and bottom spray bar 466 are positioned across the internal volume 412 and may spray the substrate 100 with deionized water or any other suitable fluid to clean the substrate 100 as the substrate 100 is removed from the particle cleaning module 282 by the robot 268. At least one of the spray bars 464, 466 may be utilized to wet the substrate 100 prior to chucking against the substrate receiver 410 to remove particles that may potentially scratch the backside of the substrate and/or to improve chucking by the substrate receiver 410. The spray bars 464, 466 may be coupled to different fluid sources 499, 500 so that different fluids may be provided to each of the spray bars 464, 466, or both spray bars 464, 466 may be coupled to a single fluid delivery source.

Referring back to the planarizing module 206 of FIG. 2, both of the second and third station 230, 232 may be used to perform CMP process as the particle cleaning module 282 substantially eliminates the need for a buffing pad disposed in one of the second and third stations 230, 232 as required in conventional systems. Since the second and third station, 230, 232 are to be used for CMP processes, the use of the particle cleaning module 282 advantageously increases the throughput of the CMP system 200. The vertical substrate orientation of the particle cleaning module 282 is also beneficial, as it removes particles in a more compact footprint as compared to traditional horizontal designs utilized on the polishing module.

Furthermore, the particle cleaning module 282 effectively cleans the substrate and decreases the loading of particulate on the brushes of the first brush module 264B and second brush module 264C. Therefore, the lifespan of the brushes in the first brush module 264B and second brush module 264C are advantageously increased. Thus, the particle cleaning module removes particularly difficult to remove polishing fluids without requiring a buffing station in the polishing module and simultaneously frees the second and or third station for additional CMP stations to increase throughput of the planarizing system.

In some implementations, the driver(s) used to rotate the substrate 100 and the actuator used to push the pads and/or polishing film against the surface of the substrate or edge of the substrate edge may be controlled by the controller 208. Likewise, operation of the fluid delivery nozzles 450, 482 may also be under the direction of the controller 208. The controller 208 may be adapted to receive feedback signals from the driver and/or actuator that indicate: (1) an amount of energy and/or torque being exerted to drive the substrate 100 (e.g., rotate a vacuum chuck holding the substrate 100) and/or (2) an amount of force applied to the actuators to push the pads 444, 480 against the substrate 100, respectively. These feedback signals may be employed to determine an amount of material that has been removed from the substrate 100, which may include, for example, whether a particular layer of material has been removed and/or whether an intended edge profile has been reached. For example, a reduction in the torque of the rotating substrate 100 (or energy expended in rotating the substrate 100) during a polishing procedure may indicate a reduction in friction between the substrate 100 and the pad 444, 480. The reduction in torque or rotational energy may correspond to an amount of material removed from the edge of the substrate 100 at or near points of contact between the substrate 100 and the pad 444, 480 and/or a characteristic edge profile (e.g., a shape, curvature or smoothness level at the edge of the substrate 100).

Alternatively or additionally, a friction sensor positioned in contact with the edge of the substrate 100 may provide signals indicative of an amount of material that has been removed from the edge of the substrate 100.

In some implementations, the pad 444, 480 may have an adjustable amount of ability to conform to the substrate's edge. In certain implementations, the pad material may be selected such that the pad 444, 480 has an adjustable amount of ability to conform to the substrate's edge. In certain implementations, the pad 444, 480 may be or include an inflatable bladder such that by adding more air or liquid or other fluid, the pad becomes harder and by reducing the amount of air or liquid or other fluid in the bladder, the pad becomes more conforming. In some implementations, the fluid supply may inflate/deflate the bladder under the direction of an operator or a programmed and/or user operated controller. In such implementations, an elastomeric material such as silicon rubber or the like may be used for the bladder to further enhance the pad's ability to stretch and conform to the substrate's edge. Such an implementation would allow an operator/controller to precisely control how far beyond the exclusion region 108a and/or 108b and into the bevels 112, 114 (if at all) (See FIG. 1) the polishing pad 480 is made to contact the substrate 100 by, e.g., limiting the amount of fluid pumped into the bladder. For example, once a substrate outer edge 110 is placed against the pad 444 with a deflated bladder, the bladder may be inflated so that the pad 444 is forced to wrap around and conform to the outer edge 110 and bevel(s) 112, 114 of the substrate 100 without wrapping around to the device region 106a, 106b of the substrate 100.

Figure 8:
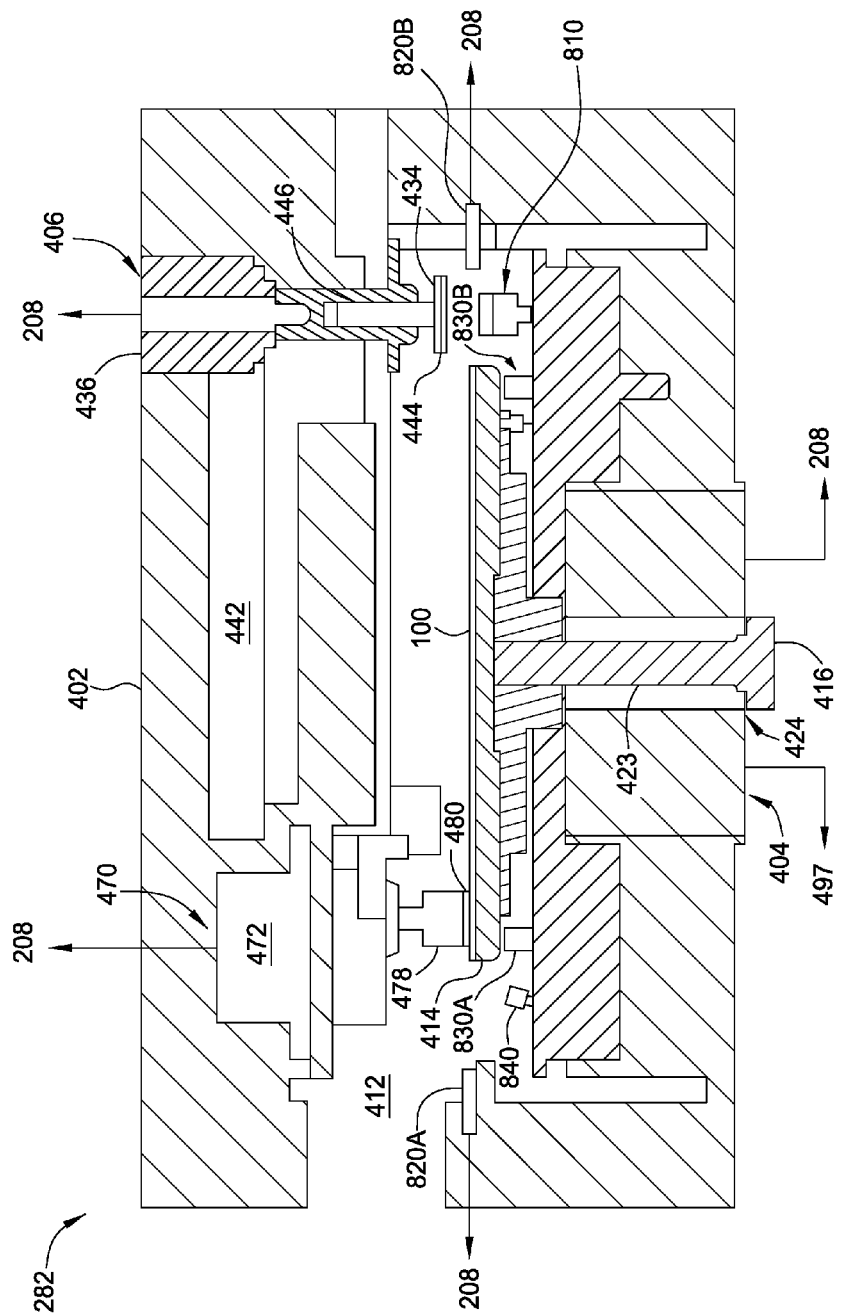
FIG. 8 is a top schematic view of the particle cleaning module having a pad conditioning assembly disposed therein.
Figure 11:
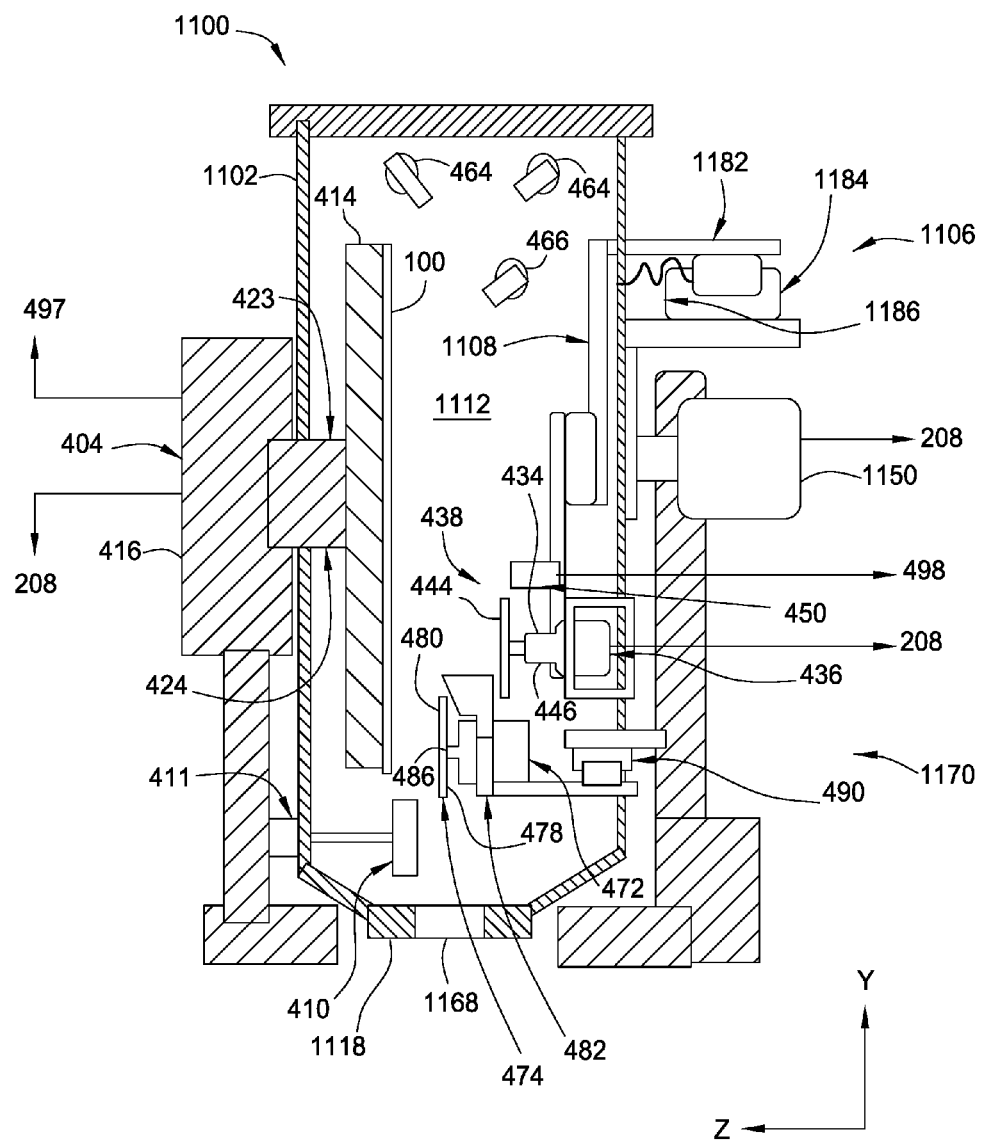
FIG. 11 is a schematic cross-sectional view of another implementation of a particle cleaning module according to implementations described herein.

FIG. 8 is a top schematic view of the particle cleaning module 282 having a pad conditioning assembly 810 for conditioning the pad 444 and a zero gap calibration sensor having sensor heads 820a, 820b positioned for detecting the position of the pad 444 disposed therein. The particle cleaning module 282 also includes a pair of cleaning nozzles 830a and 830b for directing a cleaning fluid (e.g., DI water) toward various components of the particle cleaning module 282 and a spray nozzle 840 for directing a cleaning fluid (e.g., DI water) toward the polishing pad 480 to condition and remove debris from the polishing pad 480. As depicted in FIG. 11, the second pad actuation assembly 1170 does not move in a lateral direction like the second pad actuation assembly 470 depicted in FIG. 4.

The sensor heads 820a, 820b of the zero gap calibration sensor may be coupled with the controller 208. The zero gap calibration sensor is configured to detect the position of the pad 444 relative to the surface of the substrate 100.

Figure 9C:
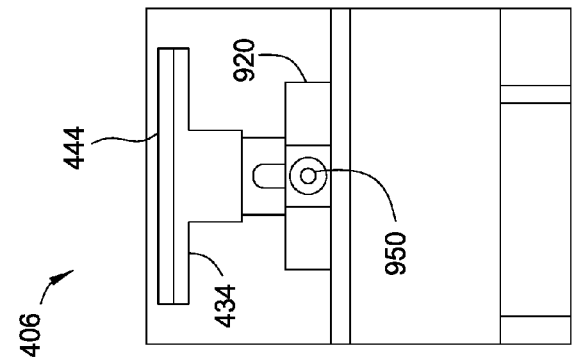
FIGS. 9A-9C are schematic views of the disk pad holder according to implementations described herein.
Figure 9B:
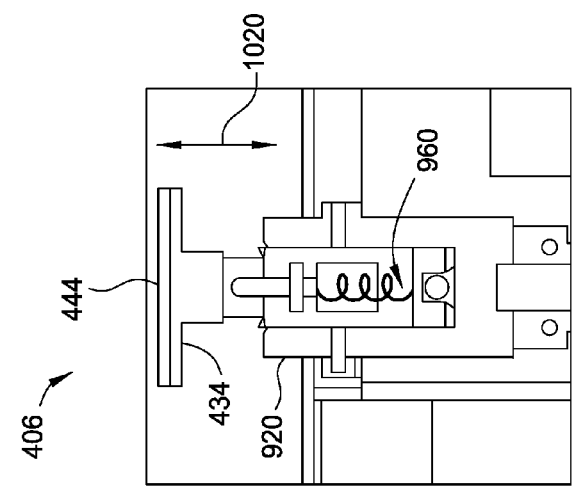
Figure 9A:
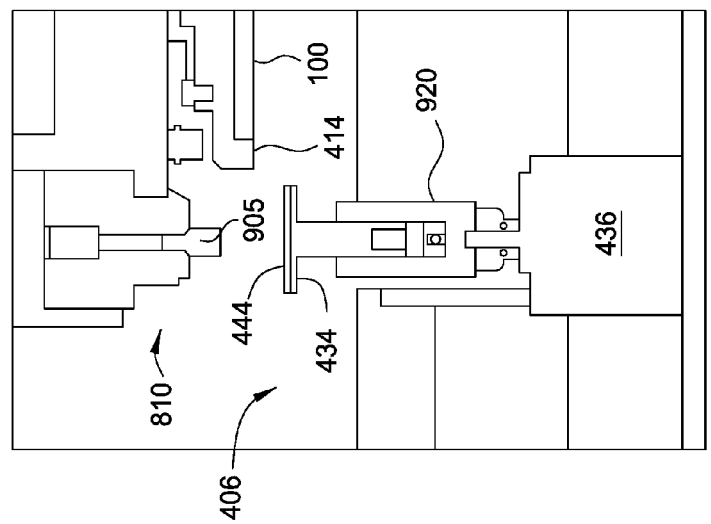

FIGS. 9A-9C are schematic views of the first pad actuation assembly 406 according to implementations described herein. FIGS. 10A-10D are schematic views of the first pad actuation assembly 406 according to implementations described herein.

FIG. 9A is a partial schematic view of the particle cleaning module 282 where the pad conditioning assembly 810 includes a high pressure spray nozzle 905 for directing a cleaning fluid toward the pad 444 of the first pad actuation assembly 406. The pad conditioning assembly 810 is positioned adjacent to the substrate holder 414 such that the first pad actuation assembly 406 may move laterally along rail 458 to the side of the substrate holder 414 where the pad 444 may be accessed by the pad conditioning assembly 810.

With reference to FIGS. 9B, 9C, 10B, 10C and 10D, the first pad actuation assembly 406 includes a first pad holder assembly 910, an adapter 920 for coupling the first pad holder 434 with the first pad holder assembly 910. The first pad holder assembly 910 may be coupled with a motor shaft 925 of the pad rotation mechanism 436. The first pad holder assembly 910 may be coupled with the pad rotation mechanism 436 via one or more attachment mechanisms 930, for example, clamping screws. The adapter 920 may be coupled with the first pad holder assembly 910 via one or more attachment mechanisms 940, for example, a locking pin. The first pad holder 434 may be coupled with the adapter 920 via one or more attachment mechanisms 950, e.g., a locking screw.

The first pad holder 434 is removable from the adapter 920 for replacement. In order to replace the pad 444, the attachment mechanism 950 only needs to be loosened and the first pad holder 434 and pad 444 may be removed without removing the first pad holder assembly 910 and adapter 920. In certain implementations, the first pad holder assembly 910 is coupled directly with the first pad holder 434 without the use of an adapter. A force control mechanism 960 (e.g., a compression spring) may be positioned between the adapter 920 and the first pad holder 434.

FIG. 10A is a schematic perspective view of one implementation of the first pad actuation assembly 406. The first pad actuation assembly 406 is coupled with the rail 458. As depicted by arrow 1010, the first pad actuation assembly 406 is movable along rail 458. The first pad actuation assembly 406 is also coupled with a second rail 1030 for movement of the first pad actuation assembly 406 in the direction shown by arrow 1020. Movement in the direction shown by arrow 1020 allows for the pad 444 to contact the substrate 100 for polishing and cleaning the substrate and also allows the pad 444 to contact the pad conditioning assembly 810 for conditioning of the pad 444.

FIG. 11 is a schematic cross-sectional view of another implementation of a particle cleaning module 1100 according to implementations described herein. The particle cleaning module 1100 may be used in place of the particle cleaning module 282 in and of the previously discussed implementations. Similar to particle cleaning module 282, particle cleaning module 1100 includes a housing 1102, a substrate rotation assembly 404, a first pad actuation assembly 1106 and a second pad actuation assembly 1170. However, unlike particle cleaning module 282, the first pad actuation assembly 1106 of particle cleaning module 1100 includes a rotary arm assembly 1108 and the second pad actuation assembly 1170 is stationary (e.g. does not move laterally along a track like the second actuation assembly 470.) Although the first pad actuation assembly 1106 and the second pad actuation assembly 1170 are shown, it should be understood that the implementations described herein may be performed with a single pad actuation assembly. For example, the first pad actuation assembly 1106 and the second pad actuation assembly 1170 may be positioned in separate housings. The housing 1102 includes an opening (not shown) at a top of the housing and a substrate receiver 410 at a bottom 1118 of the housing 1102. A drain 1168 is formed through the bottom 1118 of the housing 1102 to allow fluids to be removed from the housing 1102. The opening allows the robot 268 (not shown in FIG. 11) to vertically transfer the substrate to an internal volume 1112 defined within the housing 1102. The housing 1102 may optionally include a lid 1104 that can open and close to allow the robot 268 in and out of the housing 1102.

The substrate receiver 410 has a substrate receiving slot (not shown in FIG. 11) facing upwards parallel to the Y-axis. The receiving slot is sized to accept the perimeter of the substrate 100, thereby allowing the one of the substrate grippers 274, 276 of the substrate handler 266 (See FIG. 3) to place the substrate 100 in the receiving slot in a substantially vertical orientation. The substrate receiver 410 is coupled to a Z-Y actuator 411. The Z-Y actuator 411 may be actuated to move the substrate receiver 410 upwards in the Y-axis to align a centerline of the substrate 100 disposed in the substrate receiver 410 with a centerline of the substrate rotation assembly 404. Once the centerline of the substrate 100 is aligned with the centerline of the substrate rotation assembly 404, the Z-Y actuator 411 may be actuated to move the substrate receiver 410 in the Z-axis to contact the substrate 100 against the substrate rotation assembly 404, which then actuates to chuck the substrate 100 to the substrate rotation assembly 404. After the substrate 100 has been chucked to the substrate rotation assembly 404, the Z-Y actuator 411 may be actuated to move the substrate receiver 410 in the Y-axis clear of the substrate 100 and the substrate rotation assembly 404 so that the substrate 100 held by the substrate rotation assembly 404 may be rotated without contacting the substrate receiver 410.

The substrate rotation assembly 404 is disposed in the housing 1102 and includes a substrate holder 414 coupled to a substrate rotation mechanism 416. The substrate holder 414 may be an electrostatic chuck, a vacuum chuck, a mechanical gripper or any other suitable mechanism for securely holding the substrate 100 while the substrate is rotated during processing within the particle cleaning module 1100. Preferably, the substrate holder 414 is either an electrostatic chuck or a vacuum chuck.

The first pad actuation assembly 1106 includes the pad rotation mechanism 436, a pad cleaning head 438, and the rotary arm assembly 1108. The pad cleaning head 438 is located in the internal volume 1112 of the housing 1102 and includes the first pad holder 434 that holds the pad 444 and a fluid delivery nozzle 450. The fluid delivery nozzle 450 is coupled to a fluid delivery source 498 that provides deionized water, a chemical solution or any other suitable fluid to the pad 444 during cleaning the substrate 100.

The first pad holder 434 (and pad 444) has a diameter much less than that of the substrate 100, for example at least less than half the diameter of the substrate or even as much as less than about one eighth the diameter of the substrate. In one implementation, the first pad holder 434 (and pad 444) may have a diameter of less than about 25 mm. The first pad holder 434 may hold the pad 444 utilizing clamps, vacuum, adhesive or other suitable technique that allows for the pad 444 to periodically be replaced as the pad 444 becomes worn after cleaning a number of substrates 100.

The pad 444 may be fabricated from a polymer material, such as porous rubber, polyurethane and the like, for example, a POLYTEX™ pad available from Rodel, Inc. of Newark, Del. In one implementation, the first pad holder 434 may be used to a hold a brush or any other suitable cleaning device. The first pad holder 434 is coupled to the pad rotation mechanism 436 by a second shaft 446. The second shaft 446 is oriented parallel to the Z-axis and extends from the internal volume 1112 through an elongated slit formed through the housing 402 to the pad rotation mechanism 436. The pad rotation mechanism 436 may be an electrical motor, an air motor, or any other suitable motor for rotating the first pad holder 434 and pad 444 against the substrate. The pad rotation mechanism 436 is coupled to the controller 208. In one implementation, the pad rotation mechanism 436 rotates the first pad holder 434 (and pad 444) at a rate of at least about 1000 rpm.

The pad rotation mechanism 436 is coupled to bracket 454 by an axial actuator 440. The axial actuator 440 is coupled to the controller 208 or other suitable controller and is operable to move the first pad holder 434 along the Z-axis to move the pad 444 against and clear of the substrate 100 held by the substrate holder 414. The axial actuator 440 may be a pancake cylinder, linear actuator or any other suitable mechanism for moving the first pad holder 434 in a direction parallel to the Z-axis. In operation, after the substrate holder 414 is in contact with and holding the substrate, the axial actuator 440 drives the first pad holder 434 in a z-direction to make contact with the substrate 100.

The rotary arm assembly 1108 includes a rotary arm 1180, a rotary arm rotation motor 1150, a lateral actuator mechanism 1182 for moving the rotary arm 1180 toward the substrate 100. The lateral actuator mechanism 1182 may comprise a disk pad arm in/out cylinder coupled 1184 with a spring 1186 for force control and damping.

The second pad actuation assembly 1170 includes a pad rotation mechanism 472, and a pad polishing head 474. The pad polishing head 474 is located in the internal volume 1112 of the housing 1102 and includes the second pad holder 478 that holds a pad 480 and a fluid delivery nozzle 482. The fluid delivery nozzle 482 is coupled to a fluid delivery source 484 that provides polishing slurry, deionized water, a chemical solution or any other suitable fluid to the pad 480 during polishing of the exclusion region and/or edge region of the substrate 100.

A centerline of the second pad holder 478 may be aligned with the edge of the substrate 100. The second pad holder 478 (and polishing pad 480) has a diameter much less than that of the substrate 100, for example at least less than half the diameter of the substrate or even as much as less than about one eighth the diameter of the substrate. In one implementation, the second pad holder 478 (and polishing pad 480) may have a diameter of less than about 50 mm. The second pad holder 478 may hold the polishing pad 480 utilizing clamps, vacuum, adhesive or other suitable techniques that allow for the polishing pad 480 to periodically be replaced as the polishing pad 480 becomes worn after polishing the edge of a number of substrates 100.

The polishing pad 480 may be fabricated from a polymer material, such as porous rubber, polyurethane and the like, for example, a POLYTEX™ pad available from Rodel, Inc, of Newark, Del. The polishing pad 480 may be a fixed abrasive pad. The second pad holder 478 is coupled to the pad rotation mechanism 472 by a third shaft 486. The third shaft 486 is oriented parallel to the Z-axis and extends from the internal volume 1112 through an elongated slit formed through the housing 1102 to the pad rotation mechanism 472. The pad rotation mechanism 472 may be an electrical motor, an air motor, or any other suitable motor for rotating the second pad holder 478 and polishing pad 480 against the substrate 100. The pad rotation mechanism 472 is coupled to the controller 208. In one implementation, the pad rotation mechanism 472 rotates the second pad holder 478 (and polishing pad 480) at a rate of at least about 1000 rpm.

The pad rotation mechanism 472 is coupled to bracket 488 by an axial actuator 490. The axial actuator 490 is coupled to the controller 208 or other suitable controller and is operable to move the second pad holder 478 along the Z-axis to move the polishing pad 480 against and clear of the substrate 100 held by the substrate holder 414. The axial actuator 490 may be a pancake cylinder, linear actuator or any other suitable mechanism for moving the second pad holder 478 in a direction parallel to the Z-axis. In operation, after the substrate holder 414 is in contact with and holding the substrate, the axial actuator 490 drives the second pad holder 478 in a z-direction to make contact with the substrate 100.

Scanning the pad 444 across the substrate 100 in the particle cleaning module 1100 has effectively demonstrated the ability to effectively remove particles, such as abrasives from the polishing fluid, from the surface of the substrate 100. Further, scanning the polishing pad 480 across the exclusion region and/or edge region has demonstrated the ability to effectively remove particles, such as abrasives, excess deposited material, and/or polishing slurry from the surface of the substrate 100, for example, the exclusion region and/or edge region of the substrate. Thus, the inclusion of a polishing step at the wafer edge in addition to particle cleaning has effectively demonstrated edge defect improvement. Accordingly, the need for a dedicated buffing station on the polishing module is substantially eliminated.

Figure 12:
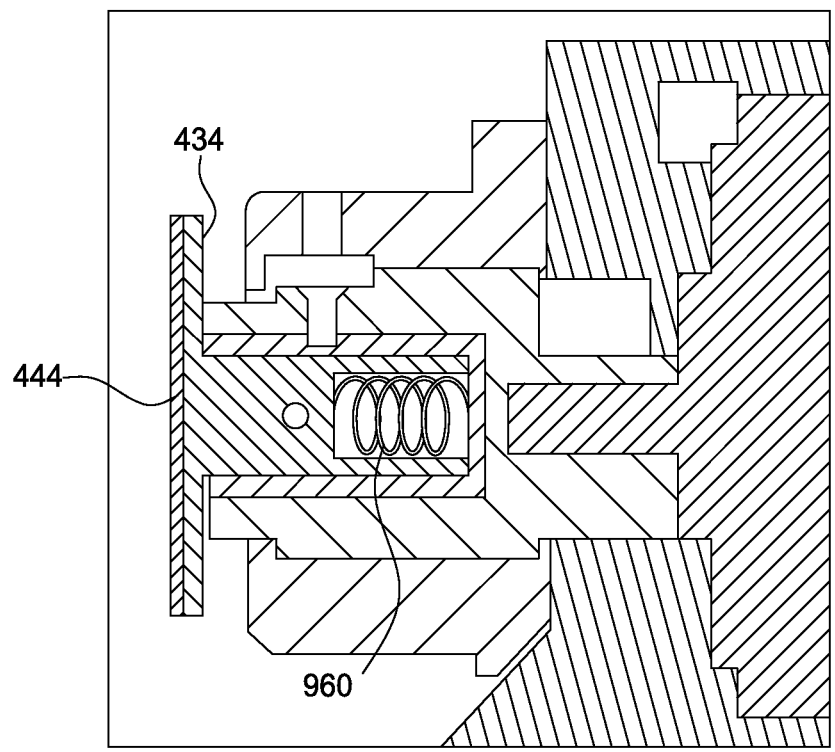
FIG. 12 is a cross-sectional schematic view of another implementation of a disk pad holder according to implementations described herein.

FIG. 12 is a cross-sectional schematic view of another implementation of a disk pad holder according to implementations described herein.

Figure 13:
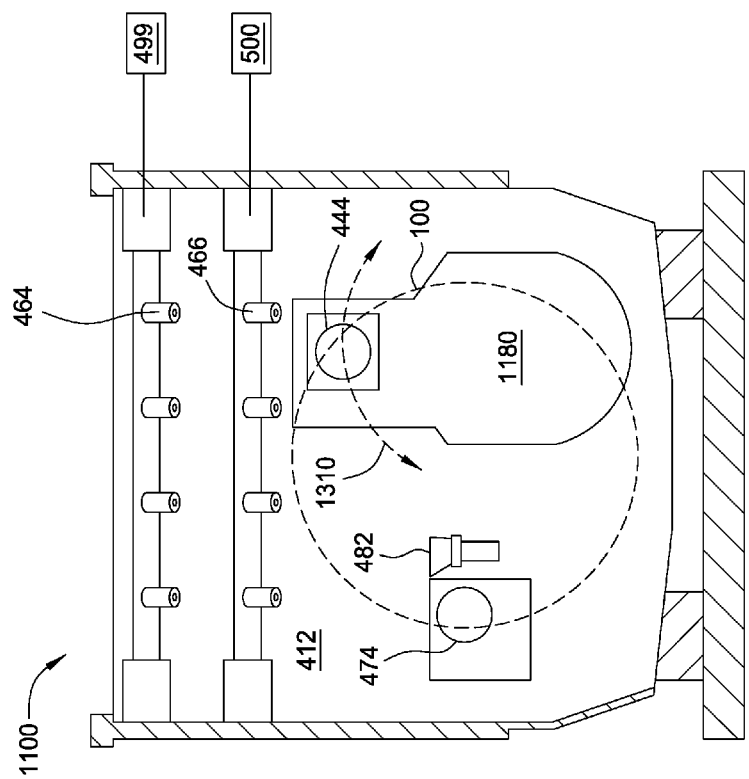
FIG. 13 is another schematic view of the particle cleaning module of FIG. 11 according to implementations described herein.

FIG. 13 is another schematic view of the particle cleaning module 1100 of FIG. 11 according to implementations described herein. FIG. 13 depicts the sweep motion of the rotary arm 1180 along a curved path as shown by arrow 1310.

Figure 14:
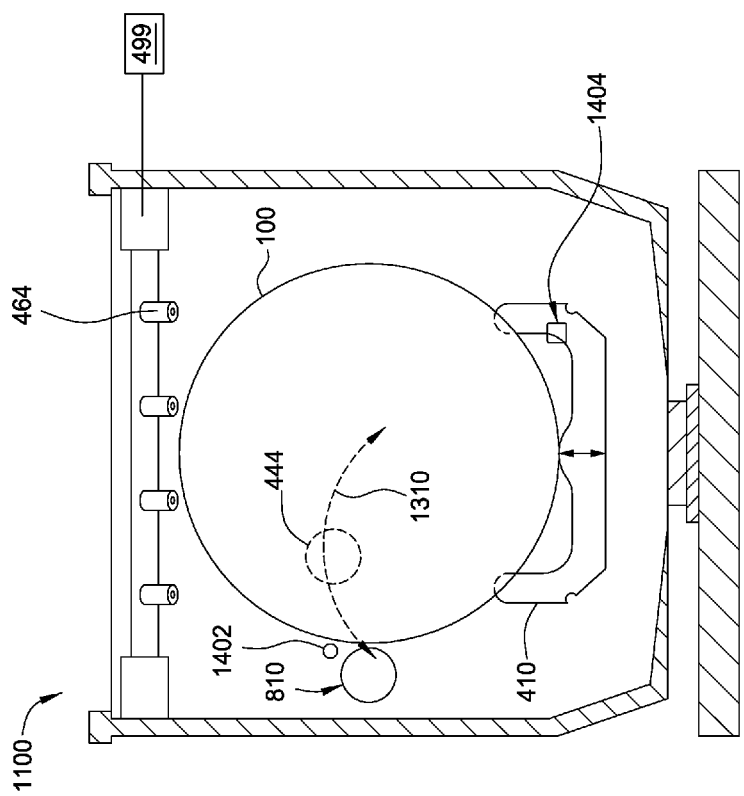
FIG. 14 is another schematic view of the particle cleaning module of FIG. 11 according to implementations described herein.

FIG. 14 is another schematic view of the particle cleaning module 1100 of FIG. 11 according to implementations described herein. FIG. 14 depicts the sweep motion of the rotary arm 1180 and the attached pad 444 along arrow 1310 to interact with the pad conditioning assembly 810 and pad clean spray nozzle 1402 for delivering a cleaning fluid (e.g., DI water) to surface of the pad 444. A sensor 1404 for detecting the presence of substrate 100 is positioned on the substrate receiver 410.

Figure 15:
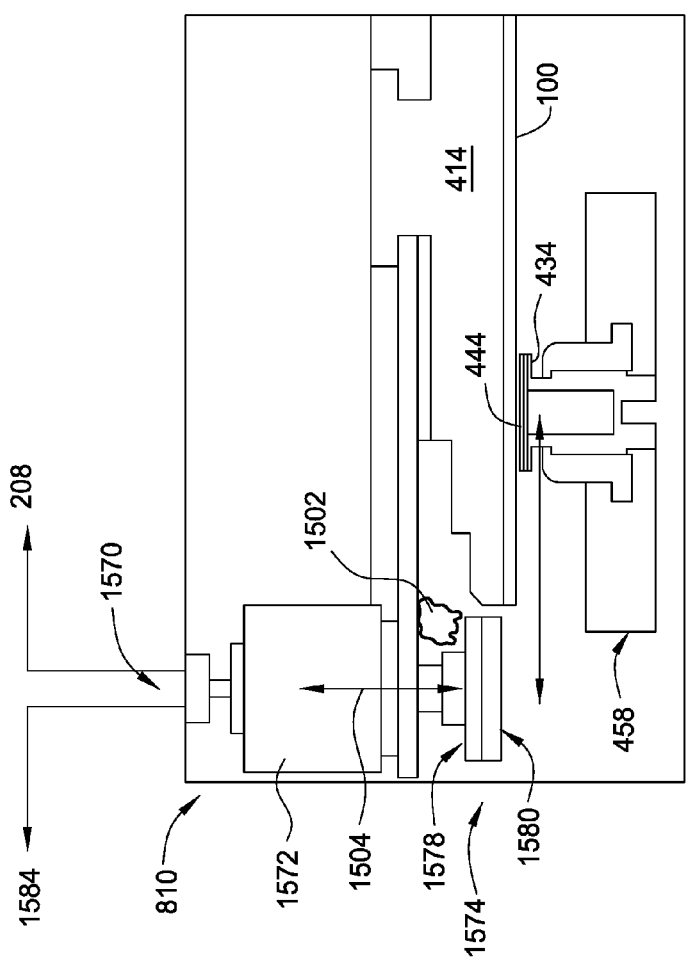
FIG. 15 is a schematic view of a portion of a particle cleaning module illustrating another implementation of a pad conditioning assembly according to implementations described herein.

FIG. 15 is a schematic view of a portion of a particle cleaning module illustrating another implementation of the pad conditioning assembly 810 according to implementations described herein. The pad conditioning assembly 810 includes a conditioning pad actuation assembly 1570 for rotating a conditioning pad 1580 and moving the conditioning pad 1580 in an axial direction 1504 toward the pad to be conditioned. The conditioning pad 1580 may be a conditioning disk. The conditioning pad actuation assembly 1570 includes a pad rotation mechanism 1572 and a pad polishing head 1574. The pad polishing head 1574 is located in the internal volume 1112 of the housing 1102 and includes a pad holder 1578 that holds the conditioning pad 1580 and a fluid delivery nozzle 1502. The fluid delivery nozzle 1502 is coupled to a fluid delivery source 1584 that provides polishing slurry, deionized water, a chemical solution or any other suitable fluid to the conditioning pad 1580 during conditioning of the pad 444.

Figure 16:
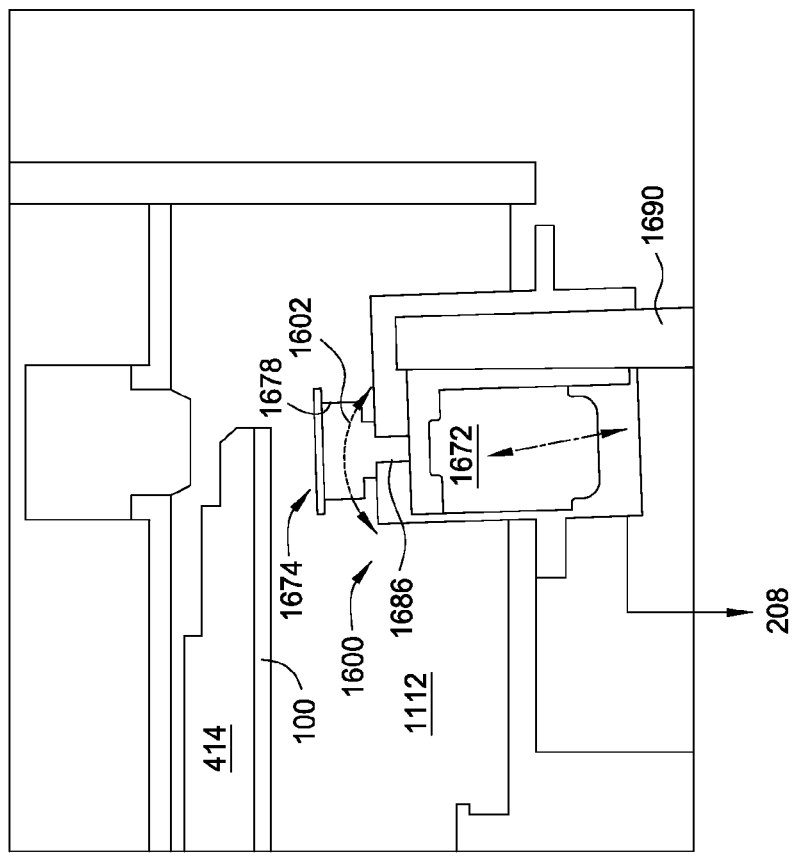
FIG. 16 is a schematic view of another implementation of an edge pad polishing assembly according to implementations described herein.

FIG. 16 is a schematic view of another implementation of an edge pad polishing assembly 1600 according to implementations described herein. The edge pad polishing assembly 1600 may be used in place of either the second pad actuation assembly 470 or the second pad actuation assembly 1170. The edge pad polishing assembly 1600 is adjustable between 1 and 10 degrees as shown by arrow 1602, which provides better access to the edge of substrate 100 for improved cleaning.

The edge pad polishing assembly 1600 includes a pad rotation mechanism 1672, a pad polishing head 1674 and an axial actuator mechanism 1690. The pad polishing head 1674 is located in the internal volume 1112 of the housing 1102 and includes an edge pad holder 1678 that holds a polishing pad 1680 and a fluid delivery nozzle. The fluid delivery nozzle is coupled to a fluid delivery source that provides polishing slurry, deionized water, a chemical solution or any other suitable fluid to the polishing pad 1680 during polishing of the exclusion region and/or edge region of the substrate 100.

A centerline of the edge pad holder 1678 may be aligned with the edge of the substrate 100. The edge pad holder 1678 (and polishing pad 1680) has a diameter much less than that of the substrate 100, for example at least less than half the diameter of the substrate or even as much as less than about one eighth the diameter of the substrate. In one implementation, the edge pad holder 1678 (and polishing pad 1680) may have a diameter of less than about 50 mm. The edge pad holder 1678 may hold the polishing pad 1680 utilizing clamps, vacuum, adhesive or other suitable techniques that allow for the polishing pad 1680 to periodically be replaced as the polishing pad 1680 becomes worn after polishing the edge of a number of substrates 100.

The polishing pad 1680 may be fabricated from a polymer material, such as porous rubber, polyurethane and the like, for example, a POLYTEX™ pad available from Rodel, Inc, of Newark, Del. The polishing pad 1680 may be a fixed abrasive pad. The edge pad holder 1678 is coupled to the pad rotation mechanism 1672 by a shaft 1686. The pad rotation mechanism 1672 may be an electrical motor, an air motor, or any other suitable motor for rotating the edge pad holder 1678 and polishing pad 1680 against the substrate 100. The pad rotation mechanism 1672 is coupled to the controller 208. In one implementation, the pad rotation mechanism 1672 rotates the edge pad holder 1678 (and polishing pad 1680) at a rate of at least about 1000 rpm.

The pad rotation mechanism 1672 may be coupled to a bracket (not shown) by an axial actuator 1690. The axial actuator 1690 is coupled to the controller 208 or other suitable controller and is operable to move the edge pad holder 1678 along the Z-axis to move the polishing pad 1680 against the edge of the substrate 100 held by the substrate holder 414. The axial actuator 1690 may be a pancake cylinder, linear actuator or any other suitable mechanism for moving the edge pad holder 1678 in a direction parallel to the Z-axis. In operation, after the substrate holder 414 is in contact with and holding the substrate, the axial actuator 1690 drives the edge pad holder 1678 in a z-direction to make contact with the substrate 100.

While the foregoing is directed to implementations of the present invention, other and further implementations of the invention may be devised without departing from the basic scope thereof, and the scope thereof is determined by the claims that follow.

The invention claimed is:

1. A particle cleaning module, comprising:
   a housing;
   a substrate holder disposed in the housing, the substrate holder configured to retain a substrate in a substantially vertical orientation, the substrate holder rotatable on a first axis;
   a first pad holder disposed in the housing, the first pad holder having a pad retaining surface facing the substrate holder in a parallel and spaced apart relation, the first pad holder rotatable on a second axis rotatable parallel to the first axis;
   a first actuator operable to move the first pad holder relative to the substrate holder to change a distance defined between the first axis and the second axis;
   a second pad holder disposed in the housing, the second pad holder having a pad retaining surface facing the substrate holder in a parallel and spaced apart relation, the second pad holder rotatable on a third axis parallel to the first axis and the second axis; and
   a rotary arm assembly, comprising:
      a rotary arm coupled with the first pad holder and operable for sweeping the first pad holder across a surface of a substrate; and
      a lateral actuator mechanism for moving the rotary arm toward the substrate holder.

2. The particle cleaning module of claim 1, further comprising:
   a third pad holder disposed in the housing, the third pad holder having a pad retaining surface for holding a conditioning disk for conditioning a second pad held by the second pad holder, the third pad holder rotatable on a fourth axis parallel to the first axis and the second axis.

3. The particle cleaning module of claim 1, wherein the pad retaining surface of the second pad holder is positioned to contact an exclusion region and/or edge portion of a substrate.

4. The particle cleaning module of claim 3, wherein a centerline of the second pad holder is aligned with the exclusion region and/or edge portion of a substrate positioned on the substrate holder.

5. The particle cleaning module of claim 1, further comprising:
   a second actuator operable to move the second pad holder relative to the substrate holder to change a distance defined between the first axis and the third axis.

6. The particle cleaning module of claim 1, further comprising:
a substrate receiver disposed in the housing, the substrate receiver having a substrate receiving slot configured to accept a substrate.

7. The particle cleaning module of claim 6, wherein the substrate receiver is operable to move between a first position that is aligned with a centerline of the substrate and a second position that is clear of the substrate.

8. The particle cleaning module of claim 1, wherein the first pad holder has a diameter less than a diameter of the substrate holder.

9. The particle cleaning module of claim 1, wherein the second pad holder has a diameter less than a diameter of the substrate holder.

10. The particle cleaning module of claim 1, wherein the second pad holder has a diameter one eighth of a diameter of the substrate holder.

11. The particle cleaning module of claim 1, wherein the substrate holder is an electrostatic chuck or a vacuum chuck.

12. The particle cleaning module of claim 1, further comprising:
a substrate rotation mechanism, operable to rotate the substrate holder about the first axis and coupled to the substrate holder by a first shaft.

13. The particle cleaning module of claim 1, further comprising:
a plurality of spray bars disposed in the housing and configured to dispense a cleaning fluid in the housing.

14. The particle cleaning module of claim 1, wherein the housing further comprises a lid configured to allow a robot in and out of the housing.

15. The particle cleaning module of claim 1, further comprising:
a pocket coupled to the housing and configured to receive the first pad holder.

16. The particle cleaning module of claim 1, wherein the first pad holder further comprises a first fluid delivery nozzle.

17. The particle cleaning module of claim 16, wherein the second pad holder further comprises a second fluid delivery nozzle.

18. The particle cleaning module of claim 1, wherein the second pad holder holds a fixed-abrasive pad.

* * * * *